US012622209B2

(12) United States Patent
Park et al.

(10) Patent No.: US 12,622,209 B2
(45) Date of Patent: May 5, 2026

(54) SUPPORTING UNIT AND APPARATUS FOR TREATING SUBSTRATE

(71) Applicant: SEMES CO., LTD., Cheonan-si (KR)

(72) Inventors: Tae Dong Park, Hwaseong-si (KR); Chung Woo Lee, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 924 days.

(21) Appl. No.: 17/895,212

(22) Filed: Aug. 25, 2022

(65) Prior Publication Data

US 2023/0075120 A1    Mar. 9, 2023

(30) Foreign Application Priority Data

Aug. 27, 2021    (KR) ........................ 10-2021-0113963

(51) Int. Cl.
H01L 21/67 (2006.01)
H01J 37/32 (2006.01)

(52) U.S. Cl.
CPC .. H01L 21/67248 (2013.01); H01J 37/32724 (2013.01); H01L 21/67103 (2013.01)

(58) Field of Classification Search
CPC .......... H01L 21/67103; H01L 21/67248; H01J 37/32724
See application file for complete search history.

(56) References Cited

U.S. PATENT DOCUMENTS

| | | | |
|---|---|---|---|
| 8,637,794 B2 | 1/2014 | Singh et al. | |
| 8,884,194 B2 | 11/2014 | Singh et al. | |
| 9,307,578 B2 | 4/2016 | Pease | |
| 9,392,643 B2 | 7/2016 | Singh et al. | |
| 9,646,861 B2 | 5/2017 | Singh et al. | |
| 9,713,200 B2 | 7/2017 | Pease | |
| 10,236,193 B2 | 3/2019 | Singh et al. | |
| 10,720,346 B2 | 7/2020 | Singh et al. | |
| 2006/0186109 A1* | 8/2006 | Goto ................ | H01L 21/67103 219/444.1 |
| 2012/0018416 A1* | 1/2012 | Goto ................ | H01L 21/68792 219/481 |
| 2013/0098895 A1* | 4/2013 | Swanson ................ | H05B 3/06 219/508 |
| 2017/0243880 A1* | 8/2017 | Matsuda ................ | H10B 43/35 |

(Continued)

FOREIGN PATENT DOCUMENTS

| | | | |
|---|---|---|---|
| CN | 102668058 A | 9/2012 | |
| JP | 2004111107 A * | 4/2004 | ....... H01L 21/67109 |

(Continued)

OTHER PUBLICATIONS

Office Action for Korean Application No. 10-2021-0113963 dated Apr. 28, 2025.

*Primary Examiner* — Woody A Lee, Jr.

(74) *Attorney, Agent, or Firm* — Harness, Dickey & Pierce, P.L.C.

(57) ABSTRACT

Provided is a supporting unit supporting a substrate. The supporting unit may include: a plate; heating elements provided to the plate and controlling a temperature of a substrate, wherein the heating elements are arranged to control temperatures of different areas of the substrate; and a power supply module supplying power to the heating element, and the power supply module may be configured to continuously supply the power to at least two heating elements of the heating elements.

4 Claims, 18 Drawing Sheets

(56)                    References Cited

U.S. PATENT DOCUMENTS

| | | | | |
|---|---|---|---|---|
| 2020/0234932 A1* | 7/2020 | Parimi | ............. | H01L 21/67103 |
| 2023/0010670 A1* | 1/2023 | Park | ................. | H01L 21/67126 |

FOREIGN PATENT DOCUMENTS

| | | | | | |
|---|---|---|---|---|---|
| JP | 2009-126152 A | | 6/2009 | | |
| KR | 20060048119 A | * | 5/2006 | ............. | H05B 3/143 |
| KR | 10-2012-0103596 A | | 9/2012 | | |
| KR | 10-2014-0051431 A | | 4/2014 | | |
| KR | 20140051431 A | * | 4/2014 | ....... | H01L 21/67248 |
| KR | 20200116045 A | * | 10/2020 | ....... | H01L 21/67126 |
| KR | 10-2021-0013247 A | | 2/2021 | | |
| KR | 20210143264 A | * | 11/2021 | ......... | C23C 18/1619 |
| WO | WO-2004030411 A1 | * | 4/2004 | ....... | H01L 21/67103 |
| WO | WO-2006006391 A1 | * | 1/2006 | ............. | H05B 3/143 |

* cited by examiner

SUPPORTING UNIT AND APPARATUS FOR TREATING SUBSTRATE

CROSS-REFERENCE TO RELATED APPLICATIONS

This application claims priority to and the benefit of the Korean Patent Application No. 10-2021-0113963 filed in the Korean Intellectual Property Office on Aug. 27, 2021, the entire contents of which are incorporated herein by reference.

TECHNICAL FIELD

The present invention relates to a supporting unit and an apparatus for treating a substrate, and more particularly, to a supporting unit capable of controlling a temperature a supported substrate and a substrate treating apparatus including the same.

BACKGROUND ART

Plasma is generated by a very high temperature, a strong electric field, or RF electromagnetic fields, and means an ionized gas condition consisting of ions, electrons, radicals and the like. In a semiconductor device manufacturing process, various processes are performed using plasma. For example, the semiconductor device manufacturing process can include an etching process of removing a thin film on a substrate by using plasma or a deposition process of depositing a film on the substrate by using the plasma.

As such, a plasma substrate treating apparatus that treats a substrate such as a wafer by using the plasma requires accuracy which allows substrate treatment to be precisely performed, repetition reproducibility which allows a treatment degree to be constant between the substrates in spite of treating multiple substrates, and uniformity which allows the treatment degree to be uniform in an entire area of a single substrate.

Meanwhile, with the development of semiconductor device manufacturing technology, there is a trend that a diameter of the substrate which is a treated object increases, and there is a trend that a critical dimension (CD) of a pattern formed on the substrate gradually decreases. Enlargement of the substrate and minuteness of the pattern make securing treatment uniformity for the substrate be difficult.

SUMMARY OF THE INVENTION

The present invention has been made in an effort to provide a supporting unit and an apparatus for treating a substrate capable of efficiently treating a substrate.

Further, the present invention has been made in an effort to provide a supporting unit and a substrate treating apparatus capable of improving uniformity of the substrate treatment.

Further, the present invention has been made in an effort to provide a supporting unit and an apparatus for treating a substrate configured for two or more heating elements to operate continuously.

Further, has been made in an effort to provide a supporting unit and a substrate treating apparatus capable of independently heating the substrate according to an area of the substrate without a complex connection structure.

The effects of the present disclosure are not limited to the aforementioned effect, and other effects, which are not mentioned above, will be apparent to a person having ordinary skill in the art from the following disclosure.

An exemplary embodiment of the present invention provides a supporting unit supporting a substrate. The supporting unit may include: a plate; heating elements provided to the plate and controlling a temperature of a substrate, wherein the heating elements are arranged to control temperatures of different areas of the substrate; and a power supply module supplying power to the heating element, and the power supply module may be configured to continuously supply the power to at least two heating elements of the heating elements.

According to an exemplary embodiment, the power supply module may include a power supply generating the power, a power supply line connected to power supply stages of the heating elements, and a power return line connected to power return stages of the heating elements.

According to an exemplary embodiment, the power supply line and the power return lines may be provided in plural, each of the heating elements may be connected to any one of the power supply lines and any one of the power return lines, and the heating elements may not share the same power supply line and power return line.

According to an exemplary embodiment, the power supply module may include a supply switch installed in the power supply line, and a return switch installed in the power return line.

According to an exemplary embodiment, the supply switch and the return switch may be provided in plural, the supply switches may be installed in the power supply lines, respectively, and the return switches may be installed in the power return lines, respectively.

According to an exemplary embodiment, the power supply module may include a first input unit receiving a control signal for controlling the supply switch from a controller, and a second input unit receiving a control signal for controlling the return switch from the controller.

According to an exemplary embodiment, the power supply module may include a determination unit that receives the controls signals received by the second input unit and outputs an On signal again when the received signals include at least two On signals.

According to an exemplary embodiment, the power supply module may include the power supply module includes a gate unit that receives the signal output by the determination unit and the signal input into the first input unit.

According to an exemplary embodiment, the gate unit may include AND gates corresponding to the supply switches, respectively, and the AND gates may receive the signal input into the first input unit and an output signal output by the determination unit.

According to an exemplary embodiment, a rectifier may be installed at a rear stage of the heating element.

Further, another exemplary embodiment of the present invention provides an apparatus for treating a substrate. The apparatus for treating a substrate may include: a chamber providing a treating space in which a substrate is treated therein; and a supporting unit supporting and heating the substrate in the treating space, and the supporting unit may include a plate, heating elements provided to the plate and heating the substrate, in which the heating elements are arranged to control temperatures of different areas of the substrate, and a power supply module supplying power to the heating element, and the power supply module may be configured to continuously supply the power to at least two heating elements of the heating elements.

According to an exemplary embodiment, the power supply module may include a power supply generating power applied to the heating element, power supply lines connected to power supply stages of the heating elements, and power return lines connected to power return stages of the heating elements.

According to an exemplary embodiment, each of the heating elements may be connected to any one of the power supply lines and any one of the power return lines, and the heating elements may not share the same power supply line and power return line.

According to an exemplary embodiment, the power supply module may include supply switches installed in the power supply lines, respectively, and return switches installed in the power return lines, respectively.

According to an exemplary embodiment, the apparatus may further include: a controller controlling the power supply module, and the power supply module may include a first input unit receiving a control signal for controlling the supply switches from the controller, and a second input unit receiving a control signal for controlling the return switches from the controller.

According to an exemplary embodiment, the controller may transmit the same control signal to the first input unit and the second input unit.

According to an exemplary embodiment, the power supply module may include a determination unit that receives the controls signals received by the second input unit and outputs an On signal again when the received signals include at least two On signals, and a gate unit that receives the signal output by the determination unit and the signal input by the first input unit.

According to an exemplary embodiment, the gate unit may include AND gates corresponding to the supply switches, respectively, and the AND gates may receive the signal input into the first input unit and an output signal output by the determination unit.

Further, yet another exemplary embodiment of the present invention provides an apparatus for treating a substrate. The apparatus for treating a substrate may include: a chamber providing a treating space in which a substrate is treated therein; a supporting unit supporting the substrate in the treating space; a plasma source generating plasma for treating the substrate in the treating space; and a controller, and the supporting unit may include a plate, heating elements provided to the plate and heating the substrate, wherein the heating elements are arranged to control temperatures of different areas of the substrate, and a power supply module supplying power to the heating element, and the power supply module may be configured to continuously supply the power to at least two heating elements of the heating elements.

According to an exemplary embodiment, the power supply module may include a power supply generating power applied to the heating element, power supply lines connected to power supply stages of the heating elements, power return lines connected to power return stages of the heating elements, supply switches installed in the power supply lines, respectively, return switches installed in the power return lines, respectively, a first input unit receiving a control signal for controlling the supply switches from the controller, a second input unit receiving a control signal for controlling the return switches from the controller, a determination unit that receives the controls signals received by the second input unit and outputs an On signal again when the received signals include at least two On signals, and a gate unit that receives the signal output by the determination unit and the signal input by the first input unit, each of the heating elements may be connected to any one of the power supply lines and any one of the power return lines, and the heating elements may not share the same power supply line and power return line.

According to an exemplary embodiment of the present invention, a substrate can be efficiently treated.

Further, according to an exemplary embodiment of the present invention, the treatment uniformity for the substrate can be improved.

Further, an object of the present invention is to provide a supporting unit and an apparatus for treating a substrate configured for two or more heating elements to operate continuously.

Further, according to an exemplary embodiment of the present invention, even though a complex connection structure is not provided, the substrate can be independently heated according to an area of the substrate.

The effect of the present invention is not limited to the foregoing effects, and non-mentioned effects will be clearly understood by those skilled in the art from the present specification and the accompanying drawings.

DETAILED DESCRIPTION

Figure 1:
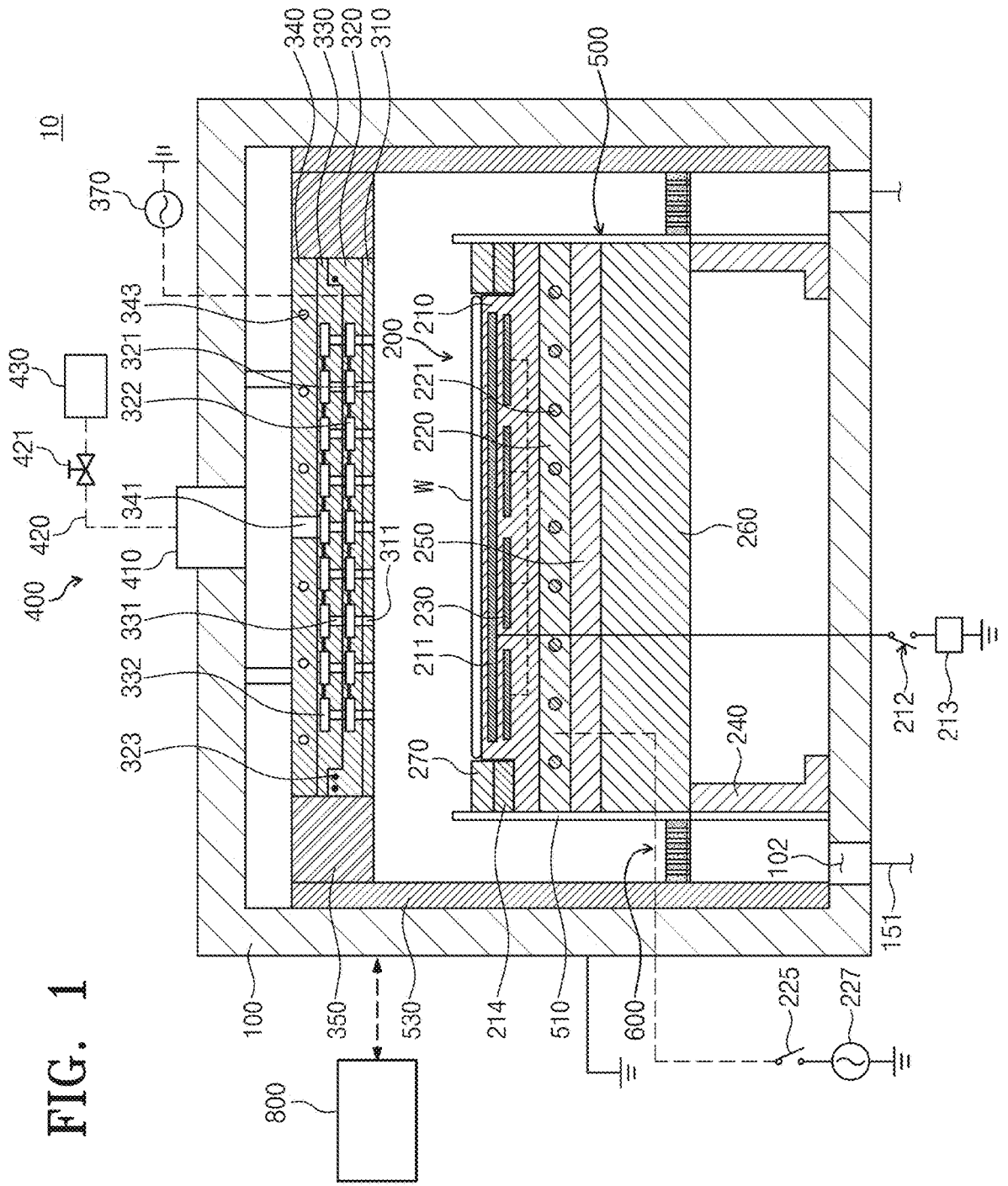
FIG. 1 is a diagram illustrating an apparatus for treating a substrate according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Further, in describing the exemplary embodiment of the present invention, detailed description of associated known function or constitutions will be omitted if it is determined that they unnecessarily make the gist of the present invention unclear. Further, the same reference numeral is used for a part which performs a similar function and a similar action through all drawings. In the following detailed description, only certain exemplary embodiments of the present invention have been shown and described, simply by way of illustration. As those skilled in the art would realize, the described embodiments may be modified in various different ways, all without departing from the spirit or scope of the present invention. In the following description of the present invention, a detailed description of known functions and configurations incorporated herein is omitted to avoid making the subject matter of the present invention unclear. Further, the same reference numeral is used for a part which performs a similar function and a similar action through all drawings.

Unless explicitly described to the contrary, the word "include" and variations such as "includes" or "including" will be understood to imply the inclusion of stated elements but not the exclusion of any other elements. Specifically, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

A singular form includes a plural form if there is no clearly opposite meaning in the context. Further, shapes, sizes, and the like of elements in the drawings may be exaggerated for clearer explanation.

The exemplary embodiment of the present invention can be modified in various forms, and it should not be construed that the scope of the present invention is limited to embodiments described below. The exemplary embodiments are provided to more completely describe the present invention to those skilled in the art. Therefore, a shape of an element in the drawing is exaggerated in order to emphasizing a more definite description.

In an exemplary embodiment of the present invention, a substrate treating apparatus of etching the substrate using plasma will be described. However, the present invention is not limited thereto, and is applicable to various types of devices for performing a process by supplying plasma in a chamber.

Hereinafter, an exemplary embodiment of the present invention will be described with reference to FIGS. 1 to 18.

First Exemplary Embodiment

FIG. 1 is a diagram illustrating a apparatus for treating a substrate according to an exemplary embodiment of the present invention.

Referring to FIG. 1, a substrate treating apparatus 10 treats a substrate W by using plasma. The substrate treating apparatus 10 may include a chamber 100, a supporting unit 200, a shower head unit 300, a gas supply unit 400, a plasma source, a linear unit 500, a baffle 600, and a controller 800.

The chamber 100 provides a treating space in which a substrate treating process is performed therein. The chamber 100 has the treating space therein. The chamber 100 is provided in a sealed shape. The chamber 100 is provided with a metallic material. As an example, the chamber 100 may be provided with an aluminum material. The chamber 100 may be grounded. An exhaust hole 102 is formed in the bottom surface of the chamber 100. The exhaust hole 102 is connected with an exhaust line 151. The exhaust line 151 is connected with a pump (not illustrated). Reaction by-products generated in the processing process and gas left in the inner space of the chamber 100 may be discharged to the outside via the exhaust line 151. The inside of the chamber 100 may be decompressed at a predetermined pressure by an exhaust process.

A heater (not illustrated) is provided to a wall of the chamber 100. The heater heats the wall of the chamber 100. The heater is electrically connected to a heating power supply (not illustrated). The heater is resistant to current applied by the heating power supply to generate heat. The heat generated in the heater is transmitted to an inner space. The treating space is maintained at a predetermined temperature by the heat generated in the heater. The heater is provided as a heat wire having a coil shape. A plurality of heaters may be provided in the wall of the chamber 100.

The supporting unit 200 may support the substrate W in the treating space 100 of the chamber 100. The supporting unit 200 may be an electrostatic chuck (ESC) which adsorbs the substrate W such as a wafer by an electrostatic scheme. Unlike this, the supporting unit 200 may also clamp the substrate W by various schemes such as mechanical clamping or clamping by vacuum adsorption.

In addition, the supporting unit 200 may control of a temperature of the supported substrate W. For example, the supporting unit 200 increases the temperature of the substrate W to increase treatment efficiency of the substrate W. The supporting unit 200 may heat the substrate W.

The supporting unit 200 may include a support plate 210 (an example of a first plate), an electrode plate 220 (an example of a second plate), a heater 230, a lower support 240, an insulating plate 250, a lower plate 260, a ring member 270, a power line module 280, and a power supply module 290.

The substrate W may be placed on the support plate 210. The support plate 210 may have a disk shape, when viewed from the top.

An upper surface of the support plate 210 may have the same radius as the substrate W. Further, the upper surface of the support plate 210 may have a larger radius than the substrate W. When the substrate W is placed on the support plate 210, a peripheral area of the substrate W may not protrude to the outside of the support plate 210. Further, the peripheral area of the support plate 210 may be stepped. An insulator 214 may be disposed in at the stepped peripheral area of the support plate 210. The insulator 214 may have a ring shape when viewed from the top.

Figure 2:
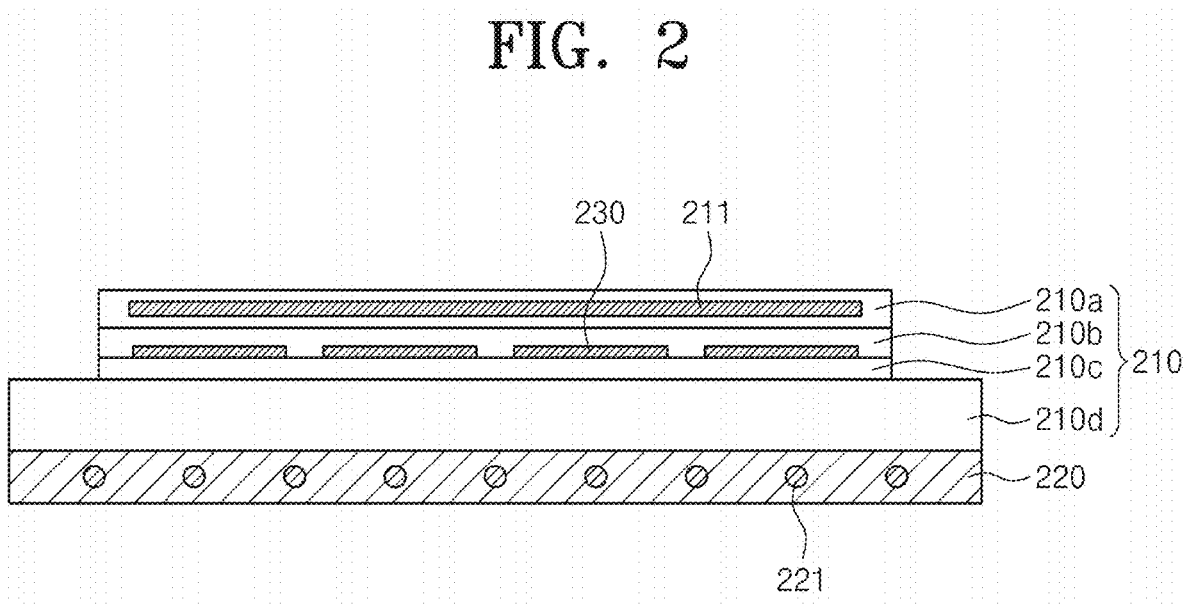
FIG. 2 is an enlarged diagram of a part of a supporting unit of FIG. 1.

FIG. 2 is an enlarged diagram of a part of the supporting unit of FIG. 1.

Referring to FIG. 2, the supporting plate 210 may include a dielectric layer 210a, a first insulating layer 210b, a second insulating layer 210c, and an adiabatic layer 210d.

An electrostatic electrode 211 may be provided in the dielectric layer 210a. For example, the electrostatic electrode 211 may be buried in the dielectric plate 210a. The electrostatic electrode 211 may be provided as a monopolar type or bipolar type. The electrostatic electrode 211 may be electrically connected to an electrostatic power supply 213. The electrostatic power supply 213 may be a DC power supply. A clamping switch 212 may be installed between the electrostatic electrode 211 and the electrostatic power supply 213. The electrostatic electrode 211 may be electrically connected to the electrostatic power supply 213 by ON/OFF of the clamping switch 212. When the switch 212 is turned on, DC current may be applied to the electrostatic electrode 211. Electrostatic force may be generated between the electrostatic electrode 211 and the substrate W by the current applied to the electrostatic electrode 211. The substrate W may be clamped to the support plate 210 by the electrostatic force. The dielectric layer 210a may be provided with a material containing a dielectric. For example, the dielectric layer 210a may be provided with a material containing ceramics.

The first insulating layer 210b and the second insulating layer 210c are combined with each other to form a cavity. There may be a plurality of cavities formed by the first insulating layer 210b and the second insulating layer 210c. The first insulating layer 210b may be disposed below the dielectric layer 210a. The second insulating layer 210c may be disposed below the first insulating layer 210b. A groove dented upward may be formed in the first insulating layer 210b, and the second insulating layer 210c is disposed below the first insulating layer 210b to form the cavities. The heating element 230 may be disposed in each of the cavities formed by the first insulating layer 210b and the second insulating layer 210c. In FIG. 2, it is illustrated as an example that the groove is formed in the first insulating layer 210b, but the present invention is not limited thereto, and a case where the groove is formed in the second insulating layer 210c may also be considered. The first insulating layer 210b and the second insulating layer 210c may be a polymer material, an inorganic material, ceramics, i.e., silicon oxide, alumina, yttrium, aluminum nitride, and other appropriate materials, and a combination thereof.

The adiabatic layer 210d may be disposed below the second insulating layer 210c. The adiabatic layer 210d may serve as a thermal barrier. For example, the heat generated by the heating element 230 transferred to a lower portion of the support unit 200 may be minimized. Further, cooling air of a cooling fluid which flows in an upper path 221 which is a cooling path to be described below, which is transferred to the insulating layers 210b and 210c in which the heating element 230 is disposed may be minimized.

The heating element 230 may control the temperature of the substrate W. The heating element 230 may heat the substrate W. The heating element 230 may generate heat by receiving power generated by the power supply module 290 to be described below via the power line module 280. The heating element 230 may be disposed in the cavity formed by the first insulating layer 210b and the second insulating layer 210c. A plurality of heating elements 230 may be provided. For example, the heating elements 230 may heat different areas of the substrate W, respectively. For example, any one of the heating elements 230 may heat a first area of the substrate W. Further, the other one of the heating elements 230 may heat a second area of the substrate W.

The heating elements 230 may be arranged to control the temperature of each of the areas of the substrate W. Further, the heating element 230 may have a plate shape. For example, the heating element 230 may also be called a heating plate. The respective heating elements 230 may have various shapes such as a rectangular shape, a pentagonal shape, etc. Further, the heating element 230 may be a resistive heater, i.e., a polyimide heater, a silicon rubber heater, a mica heater, a metal heater, a ceramic heater, a semiconductor heater, or a carbon heater.

Further, an area of the heating element 230 may be an area larger than a die manufactured on the substrate W or corresponding thereto. For example, the area of each heating element 230 may be 2 cm$^2$ to 3 cm$^2$. Further, a thickness of each heating element 230 may be 2 micrometers to 1 millimeter, and more specifically, also in a range of 5 to 80 micrometers. Further, when viewed from the top, a total area occupied by the heating elements 230 may be 50 to 90% of an area of the upper surface of the supporting unit 200, e.g., the upper surface of the support plate 210. For example, when viewed from the top, a total area occupied by the heating elements 230 may be 90% of the upper surface of the support plate 210.

The electrode plate 220 may be provided below the support plate 210. The upper surface of the electrode plate 220 may be in contact with a lower surface of the support plate 210. The electrode plate 220 may be provided in a disk shape. The electrode plate 220 is provided with a conductive material. As an example, the electrode plate 220 may be provided with an aluminum material. An upper path 221 which is a channel in which the cooling fluid flows may be formed inside the electrode plate 220. The upper path 221 primarily cools the support plate 210. The cooling fluid may be supplied to the upper path 221. As an example, the cooling fluid may be provided as cooling water or cooling gas. Further, the electrode plate 220 may also be the cooling plate. Further, in the above-described example, it is described as an example that the upper path 221 which is the cooling path in which the cooling fluid flows is formed in the electrode plate 220, but the cooling plate may be provided separately from the electrode plate 220. For example, the cooling plate is disposed above or below the electrode plate 220, but the path in which the cooling fluid flows is formed in the cooling plate, and the upper path 221 may not be formed in the electrode plate 220.

Referring back to FIG. 1, the electrode plate 220 may be provided as the metal plate. The electrode plate 220 may be electrically connected to a lower power supply 227. The lower power supply 227 may be provided as a high-frequency power supply for generating high-frequency power. The high-frequency power supply may be provided as an RF power supply. The RF power supply may be provided as a high bias power RF power supply. The electrode plate 220 may selectively receive the high-frequency power by switching the lower switch 225 from the lower power supply 227. Unlike this, the electrode plate 220 may be grounded and provided.

The insulating plate 250 may be provided below the electrode plate 220. The plate 250 may be provided in a circular disk shape. The insulating plate 250 may be provided as an area corresponding to the electrode plate 220. The insulating t plate 250 may be provided as the insulating plate. As an example, the plate 250 may be provided as a dielectric.

The lower support 240 is provided below the electrode plate 220. The lower support 240 is provided below the lower plate 260. The lower support 240 is provided in a ring shape.

The lower plate 260 is positioned below the insulating plate 250. The lower plate 260 may be provided with the aluminum material. The lower plate 260 may be provided in a circular shape when viewed from the top. The lower plate 260 may have an inner space. In the inner space of the lower plate 260, a lift pin module (not illustrated) that moves the substrate W from an outer transfer member to the support plate 210 may be positioned.

The ring member 270 is disposed at a peripheral area of the supporting unit 200. The ring member 270 has a ring shape. The ring member 270 is provided while surrounding the upper portion of the support plate 210. The ring member 270 may be provided above the insulator 214 disposed at the peripheral area of the support plate 210. The ring member 270 may be provided as a focus ring.

A shower head unit 300 is positioned above the supporting unit 200 inside the chamber 100. The shower head unit 300 is positioned to be opposite to the supporting unit 200. The shower head unit 300 includes a shower head 310, a gas spraying plate 320, a cover plate 330, an upper plate 340, and an insulating ring 350.

The shower head 310 is located at a predetermined distance downward from the upper surface of the chamber 100. The shower head 310 is disposed above the supporting unit 200. A predetermined space is formed between the shower head 310 and the upper surface of the chamber 100. The shower head 310 may be provided in a plate shape with a constant thickness. The surface of the lower surface of the shower head 310 may be polarized to prevent arc occurrence by the plasma. The cross section of the shower head 310 may be provided to have the same shape and cross-sectional area as the supporting unit 200. The shower head 310 includes a plurality of spraying holes 311. The spraying hole 311 penetrates the upper surface and the lower surface of the shower head 310 in a vertical direction.

The shower head 310 may be provided with a material that reacts with the plasma generated from the gas supplied by the gas supply unit 400 to generate a compound. For example, the shower head 310 may be provided with a material that reacts with an ion having the largest electro negativity among ions included in the plasma to generate a compound. For example, the shower head 310 may be provided with a material containing silicon (Si). Further, a compound generated by a reaction of the shower head 310 and the plasma may be silicon tetrafluoride.

The shower head 310 may be electrically connected to an upper power supply 370. The upper power supply 370 may be provided as the high-frequency power supply. Unlike this, the shower head 310 may also be electrically grounded.

The gas injection plate 320 may be disposed on the upper surface of the shower head 310. The gas injection plate 320 may be located to be spaced apart from the upper surface of the chamber 100 by a predetermined distance. The shower head 320 may be provided in a plate shape with a constant thickness. A heater 323 is provided at the peripheral area of the gas injection plate 320. The heater 323 heats the gas injection plate 320.

A diffusion area 322 and an injection hole 321 are provided in the gas injection plate 320. The diffusion area 322 evenly sprays gas supplied from the top to the injection hole 321. The diffusion area 322 is connected to the injection hole 321 therebelow. Contiguous diffusion areas 322 are connected to each other. The injection hole 321 is connected to the diffusion area 322 to penetrate the lower surface in the vertical direction.

The injection hole 321 is located to be opposite to the injection hole 311 of the shower head 310. The gas injection plate 320 may include a metal material.

The cover plate 330 is located above the gas injection plate 320. The cover plate 330 may be provided in a plate shape with a constant thickness. A diffusion area 332 and an injection hole 331 are provided in the cover plate 330. The diffusion area 332 evenly sprays gas supplied from the top to the injection hole 331. The diffusion area 332 is connected to the injection hole 331 therebelow. Contiguous diffusion areas 332 are connected to each other. The injection hole 331 is connected to the diffusion area 332 to penetrate the lower surface in the vertical direction.

The upper plate 340 is located above the cover plate 330. The upper plate 340 may be provided in a plate shape with a constant thickness. The upper plate 340 may be provided with the same size as the cover plate 330. The upper plate 340 has a supply hole 341 formed at the center thereof. The supply hole 341 is a hole through which gas passes. The gas passing through the supply hole 341 is supplied to the diffusion area 332 of the cover plate 330. A cooling path 343 is formed inside the upper plate 340. The cooling fluid may be supplied to the cooling path 343. As an example, the cooling fluid may be provided as the cooling water.

Further, the shower head 310, the gas injection plate 320, the cover plate 330, and the upper plate 340 may be supported by a rod. For example, the shower head 310, the gas injection plate 320, the cover plate 330, and the upper plate 340 may be coupled to each other, and supported by a rod fixed to the upper surface of the upper plate 340. Further, the rod may be coupled to the inside of the chamber 100.

The insulating ring 350 is disposed to surround circumferences of the shower head 310, the gas injection plate 320, the cover plate 330, and the upper plate 340. The insulating ring 350 may be provided in a circular ring shape. The insulating ring 350 may be provided with a non-metallic material. The insulating ring 350 is located to overlap with the ring member 270 when viewed from the top. When viewed from the top, a surface where the insulating ring 350 and the shower head are in contact with each other is located to overlap with an upper area of the ring member 270.

The gas supply unit 400 may supply gas into the chamber 100. The gas supplied by the gas supply unit 400 may be excited in a plasma state by a plasma source. Further, the gas supplied by the gas supply unit 400 may be gas containing fluorine. For example, the gas supplied by the gas supply unit 400 may be tetrafluoromethane.

The gas supply unit 400 may include a gas supply nozzle 410, a gas supply line 420, and a gas storage unit 430. The gas supply nozzle 410 is installed at the center of the upper surface of the chamber 100. An injection port is formed on the lower surface of the gas supply nozzle 410. The injection port may supply process gas into the chamber 100. The gas supply line 420 connects the gas supply nozzle 410 and the gas storage unit 430 to each other. The gas supply line 420 supplies the process gas stored in the gas storage unit 430 to the gas supply nozzle 410. The gas supply line 420 may be provided with a valve 421. The valve 421 opens and closes the gas supply line 420 and adjusts the flow rate of the process gas supplied through the gas supply line 420.

The plasma source excites the process gas in the chamber 100 in a plasma state. In the exemplary embodiment of the present invention, capacitively coupled plasma (CCP) is used as the plasma source. The CCP may include an upper electrode and a lower electrode inside the chamber 100. The upper electrode and the lower electrode may be vertically disposed in parallel to each other inside the chamber 100. Any one of both the electrodes applies high frequency power, and the other electrode may be grounded. An electromagnetic field is formed in a space between the both electrodes, and the process gas supplied to the space may be excited into the plasma state. A substrate W treating process is performed using this plasma. According to an example, the upper electrode may be provided to the shower head unit 300 and the lower electrode may be provided to the electrode plate. The high frequency power may be applied to the lower electrode, and the upper electrode may be grounded. Unlike this, the high frequency power may be applied to both the upper electrode and the lower electrode. As a result, an electromagnetic field is generated between the upper electrode and the lower electrode. The generated electromagnetic field excites the process gas provided inside the chamber 100 into a plasma state.

The liner unit 500 prevents the inner wall of the chamber 100 and the supporting unit 200 from being damaged during the process. The liner unit 500 prevents impurities generated in the process from being deposited on the inner wall and the supporting unit 200. The liner unit 500 includes an inner liner 510 and an outer liner 530.

The outer liner 530 is provided on the inner wall of the chamber 100. The outer liner 530 has a space with opened upper surface and lower surface. The outer liner 530 may be provided in a cylindrical shape. The outer liner 530 may have a radius corresponding to the inner surface of the chamber 100. The outer liner 530 is provided along the inner surface of the chamber 100.

The outer liner 530 may be provided with an aluminum material. The outer liner 530 protects the inner surface of the chamber 110. An arc discharge may be generated in the chamber 100 in a process in which process gas is excited. The arc discharge damages the chamber 100. The outer liner (not illustrated) protects the inner surface of the chamber 110 to prevent the inner surface of the chamber 110 from being damaged by the arc discharge.

The inner liner (not illustrated) is provided to cover the supporting unit 200. The inner liner 510 is provided in a ring shape. The inner liner 510 is provided to surround the support plate 210, the electrode plate 220, and the lower support 240. The inner liner 510 may be provided with an aluminum material. The inner liner 510 protects the outer surface of the supporting unit 200.

The baffle unit 600 is located between the inner wall of the chamber 100 and the supporting unit 200. The baffle is provided in a circular ring shape. A plurality of through-holes is formed in the baffle. The process gas provided in the housing 100 is exhausted to the exhaust hole 102 through the through-holes of the baffle. The flow of the gas may be controlled according to the shape of the baffle and the shapes of the through-holes.

The controller 800 may control the substrate treating apparatus 10. The controller 800 may control the substrate treating apparatus 10 so that the substrate treating apparatus 10 may perform a plasma treatment process for the substrate W. Further, the controller 800 may control the power supply module 290 to be described below. Further, the controller 800 may control the power supply module 290 to be described below to heat a plurality of areas of the substrate W.

The controller 800 may include a processor controller consisting of a microprocessor (computer) executing a control of the substrate treating apparatus 10, a keyboard for performing a command input operation and the like to manage the substrate treating apparatus 10 by an operator, a user interface consisting of a display and the like for visualizing and displaying an moving situation of the substrate treating apparatus 10, and a storage unit stored with control programs or various data for executing the treatment executed in the substrate treating apparatus 10 by the control of the process controller and programs, that is, treatment recipes for executing the treatment in each configuration unit according to a treatment condition. In addition, the user interface and the storage unit may be connected to the process controller. The treating recipes may be stored in a storage medium in the storage unit, and the storage medium may be a hard disk, and a transportable disk such as a CD-ROM, a DVD, and the like or a semiconductor memory such as a flash memory and the like.

Hereinafter, the power line module 280 and the power supply module 290 applying power to the heating element 230 according to the present invention will be described. Further, a method for supplying the power to the heating element 130 according to the present invention will be described. The power supply module 290 may also be implemented by hardware, software, or a combination of the hardware and the software.

Figure 3:
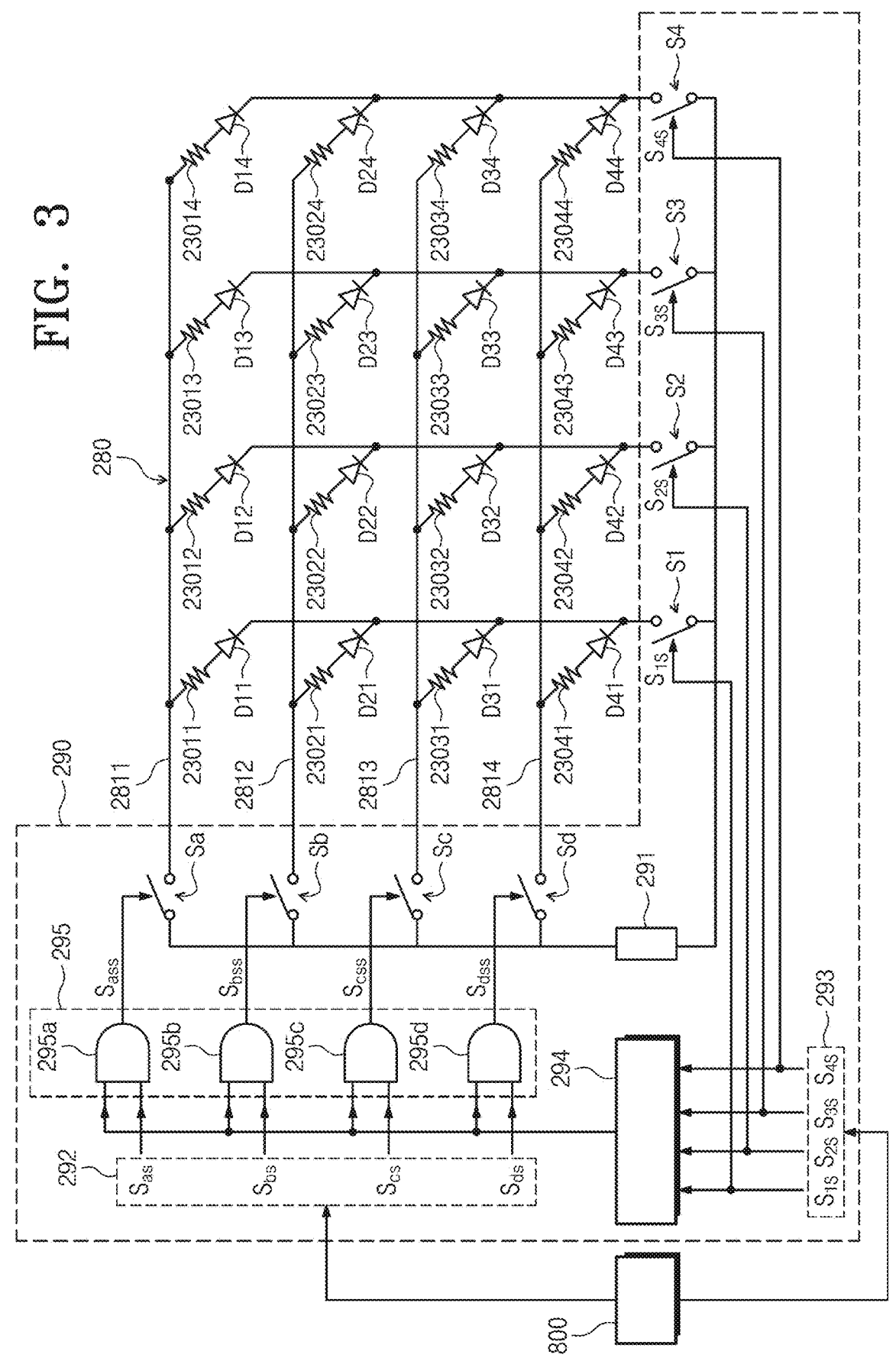
FIG. 3 is a diagram schematically illustrating a circuit structure including a power line module, a power supply module, and heating elements of a supporting unit according to a first exemplary embodiment of the present invention.
Figure 4:
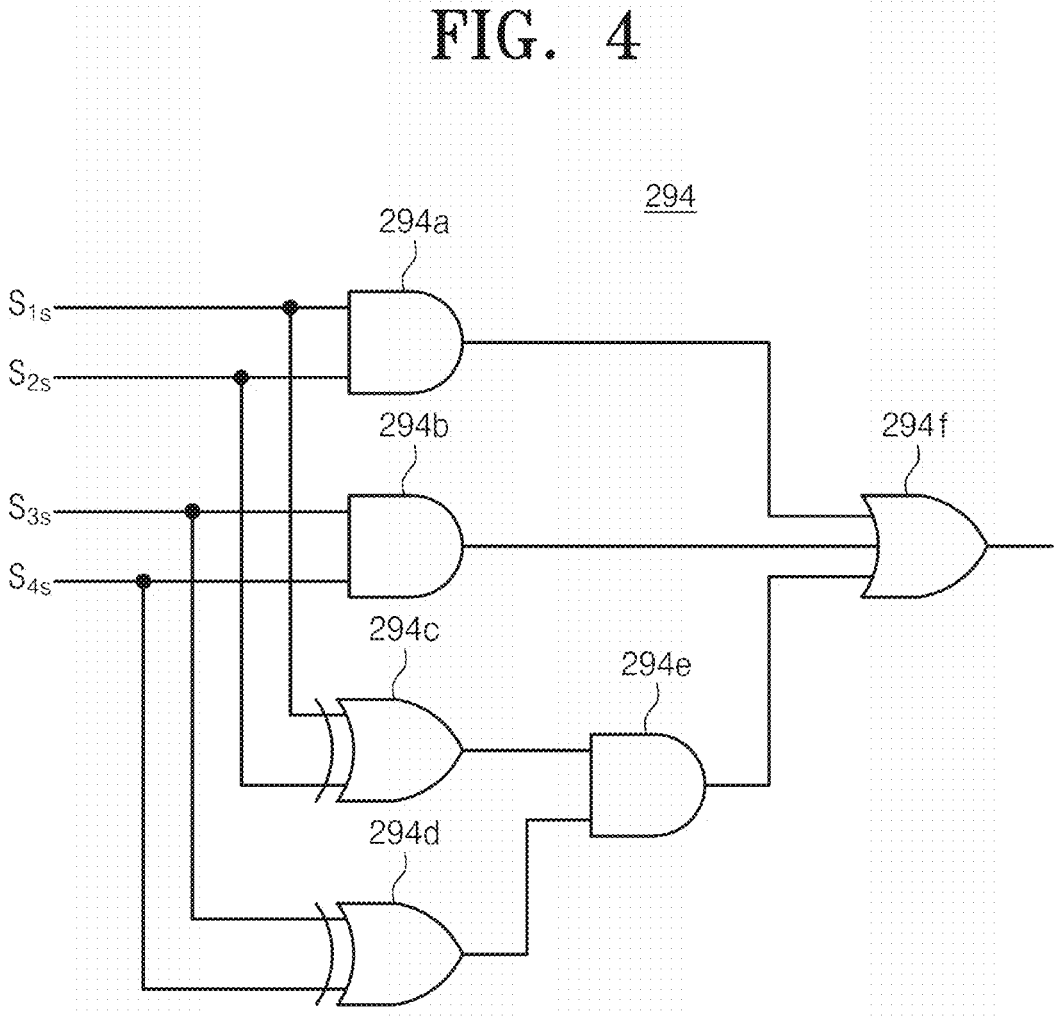
FIG. 4 is a diagram illustrating logic of a determination unit of FIG. 3.

FIG. 3 is a diagram schematically illustrating a circuit structure including a power line module, a power supply module, and heating elements of a supporting unit according to a first exemplary embodiment of the present invention.

Referring to FIG. 3, the heating elements 230 may be arranged to control temperatures of different areas of a substrate W. The heating elements 230 may be arranged in a matrix pattern so as to control the temperatures of the respective areas of the substrate W. The heating elements 230 may be provided in an array of M×N. For example, a total of heating elements 16 may be provided in an array of 4×4. However, the heating elements 230 are not limited thereto, and the total number of heating elements 230 may be variously changed as necessary.

Hereinafter, the heating element 230 disposed in (M, N) of an M×N pattern may be referred to as M-Nth heating element 230MN. For example, the heating element 230 disposed in (1, 1) of the M×N pattern may be referred to as 1-1$^{st}$ heating element 23011. The heating element 230 disposed in (1, 2) of the M×N pattern may be referred to as 1-2$^{nd}$ heating element 23012. The heating element 230 disposed in (3, 1) of the M×N pattern may be referred to as 3-1$^{st}$ heating element 23031.

The power line module 280 may transfer power generated by the power supply module 290 to the heating element 230. The power line module 280 may include the power supply line 281 and a power return line 282.

The power line module 281 may transfer power generated by the power supply module 290 to the heating element 230. The power supply line 281 may be connected to power supply stages of the heating elements 230.

A plurality of power supply lines 281 may be provided. For example, power supply lines 281 of M which is the number of rows of the M×N pattern may be provided. For example, the power supply line 281 electrically connected to a group of heating elements 230 disposed at a first row of the M×N pattern may be referred to as first power supply line 2811. Further, the power supply line electrically connected to a group of heating elements 230 disposed at a second row of the M×N pattern may be referred to as second power supply line 2812. Further, the power supply line electrically connected to a group of heating elements 230 disposed at an Mth row of the M×N pattern may be referred to as Mth power supply line 281M.

The power return line 282 may return the power transferred to the heating element 230 to the power supply module 290. The power return line 282 may be connected to power return stages of the heating elements 230. Further, a rectifier D may be installed on the power return line 282, which allows current generated by a power supply 291 to flow in one direction. The rectifier D corresponding to the M-Nth heating element 230MN may be called M-Nth rectifier DMN. For example, the rectifier D corresponding to the 1-1$^{st}$ heating element 23011 may be referred to as 1-1$^{st}$ rectifier D11 and the rectifier D corresponding to the 1-2$^{nd}$ heating element 23012 may be referred to as 1-2$^{nd}$ heating element D12.

A plurality of power return lines 282 may be provided. For example, power return lines 282 of N which is the number of columns of the M×N pattern may be provided. For example, the power return line 282 electrically connected to a group of heating elements 230 disposed at a first column of the M×N pattern may be referred to as first return supply line 2821. Further, the power return line 282 electrically connected to the group of the heating elements 230 disposed at the first column of the M×N pattern may be referred to as second return supply line 2822. Further, the power supply line electrically connected to the group of heating elements 230 disposed at an Nth column of the M×N pattern may be referred to as Nth power return line 282N.

Further, the respective heating elements 230 may not share the same power supply line 281 and power return line 282. For example, the 1-1st heating element 23011 may be electrically connected to the first power supply line 2811 and electrically connected to the first power return line 2821. The 1-2$^{nd}$ heating element 23012 may be electrically connected to the first power supply line 2811 and electrically connected to the second power return line 2822. When the 1-1st heating element 23011 and the 1-2$^{nd}$ heating element 23012 are compared with each other, the 1-1st heating element 23011 and the 1-2$^{nd}$ heating element 23012 share the first power supply line 2811, but does not sharer the power return line 2822. This is to solve a problem in that heat emission of each heating element 230 is independently controlled, but in this case, the connection of the power supply line 281 and the power return line 282 may be complicated. When the connection between the power supply line 281 and the power return line 282 becomes complicated, a problem such as a short may frequently occur and maintenance becomes difficult. However, according to an exemplary embodiment of the present invention, each of the heating elements 230 is connected to any one of the power supply lines 281 and any one of the power return lines 282, but the heating elements 230 do not share the same power supply line and power return line, so independent control of the heating element 230 and simplification of the connection may be implemented.

The power supply module 290 may apply the power to the heating element 230 via the power line module 280. The power supply module 290 may be configured to continuously supply the power to two or more heating elements 230. The power supply module 290 may include supply switches Sa, Sb, Sc, and Sd, return switches S1, S2, S3, and S4, a power supply 291, a first input unit 292, a second input unit 293, a determination unit 294, and a gate unit 295.

The supply switches Sa, Sb, Sc, and Sd may be installed in the power supply line 281. The supply switches Sa, Sb, Sc, and Sd may be installed in the power supply lines 281, respectively. The supply switches Sa, Sb, Sc, and Sd may include a first supply switch Sa installed in the first power supply line 2811, a second supply switch Sb installed in the second power supply line 2812, a third supply switch Sc installed in the third power supply line 2813, and a fourth supply switch Sd installed in the fourth power supply line 2814.

The return switches S1, S2, S3, and S4 may be installed in the power return line 282. The return switches S1, S2, S3, and S4 may be installed in the power return lines 282, respectively. The return switches S1, S2, S3, and S4 may include a first return switch S1 installed in the first power return line 2821, a second return switch S2 installed in the second return supply line 2822, a third return switch S3 installed in the third return line 2823, and a fourth return switch S4 installed in the fourth power return line 2824.

The heating elements 230 may be provided between the power supply line 281 and the power return line 282.

The power supply 291 may be provided inside a closed circuit which may be formed by the power supply line 281 and the power return line 282. The power supply 291 may be a DC or AC power supply. The power supply 291 may generate power for driving (i.e., heating) the heating element 230.

The first input unit 292 may receive a control signal applied by the controller 800. The first input unit 292 may receive the control signal applied by the controller 800 and transfer the control signal to the gate unit 295 to be described below. The control signal transferred to the gate unit 295 may control the supply switches Sa, Sb, Sc, and Sd.

The second input unit 293 may receive the control signal applied by the controller 800. The second input unit 293 may receive the control signal applied by the controller 800 and transfer the control signal to the return switches S1, S2, S3, and S4. Further, the second input unit 293 may transfer the control signal applied by the controller 800 to the determination unit 294 to be described below.

The determination unit 294 may receive the control signals received by the second input unit 293 as it is, and determine true or false by comparing with a truth table in which the received signal is prestored. In the case of true, an On signal may be output and in the case of false, an Off signal may be output. Hereinafter, a signal for turning on the supply switch and the return signal is referred to as "1" and a signal for turning off the supply switch and the return switch is referred to as "0".

The truth table stored in the determination unit 294 may be as follows.

TABLE 1

| Set | $S_{1S}$ | $S_{2S}$ | $S_{3S}$ | $S_{4S}$ | Output |
|-----|-----|-----|-----|-----|--------|
| 0 | 0 | 0 | 0 | 0 | FALSE |
| 1 | 0 | 0 | 0 | 1 | FALSE |
| 2 | 0 | 0 | 1 | 0 | FALSE |
| 3 | 0 | 0 | 1 | 1 | TRUE |
| 4 | 0 | 1 | 0 | 0 | FALSE |
| 5 | 0 | 1 | 0 | 1 | TRUE |
| 6 | 0 | 1 | 1 | 0 | TRUE |
| 7 | 0 | 1 | 1 | 1 | TRUE |
| 8 | 1 | 0 | 0 | 0 | FALSE |
| 9 | 1 | 0 | 0 | 1 | TRUE |
| 10 | 1 | 0 | 1 | 0 | TRUE |
| 11 | 1 | 0 | 1 | 1 | TRUE |
| 12 | 1 | 1 | 0 | 0 | TRUE |
| 13 | 1 | 1 | 0 | 1 | TRUE |
| 14 | 1 | 1 | 1 | 0 | TRUE |
| 15 | 1 | 1 | 1 | 1 | TRUE |

That is, the determination unit 294 may output the On signal again when the signal received by the second input unit 293 includes two or more On signals. The determination unit 294 may be implemented by hardware logic as in FIG. 4. The determination unit 294 may be constituted by AND gates 294*a*, 294*b*, and 294*e*, XOR gates 294*c* and 294*d*, and an OR gate 294*f*. Further, the determination unit 294 may also be simply implemented as a software or field program gate array (FPGA) form in addition to hardware logic. The signal output by the determination unit 294 may be transferred to the gate unit 295.

Referring back to FIG. 3, the gate unit 295 may receive an input signal which the controller 800 transfers to the first input unit 292. Further, the gate unit 295 may receive the signal output by the determination unit 294.

The gate unit 295 may include a plurality of AND gates 295*a*, 295*b*, 295*c*, and 295*d*. The AND gates 295*a*, 295*b*, 295*c*, and 295*d* may include a first AND gate 295*a* corresponding to the first supply switch Sa, a second AND gate 295*b* corresponding to the second supply switch Sb, a third AND gate 295*c* corresponding to the third switch Sc, and a fourth AND gate 295*d* corresponding to the fourth supply switch Sd.

Figure 5:
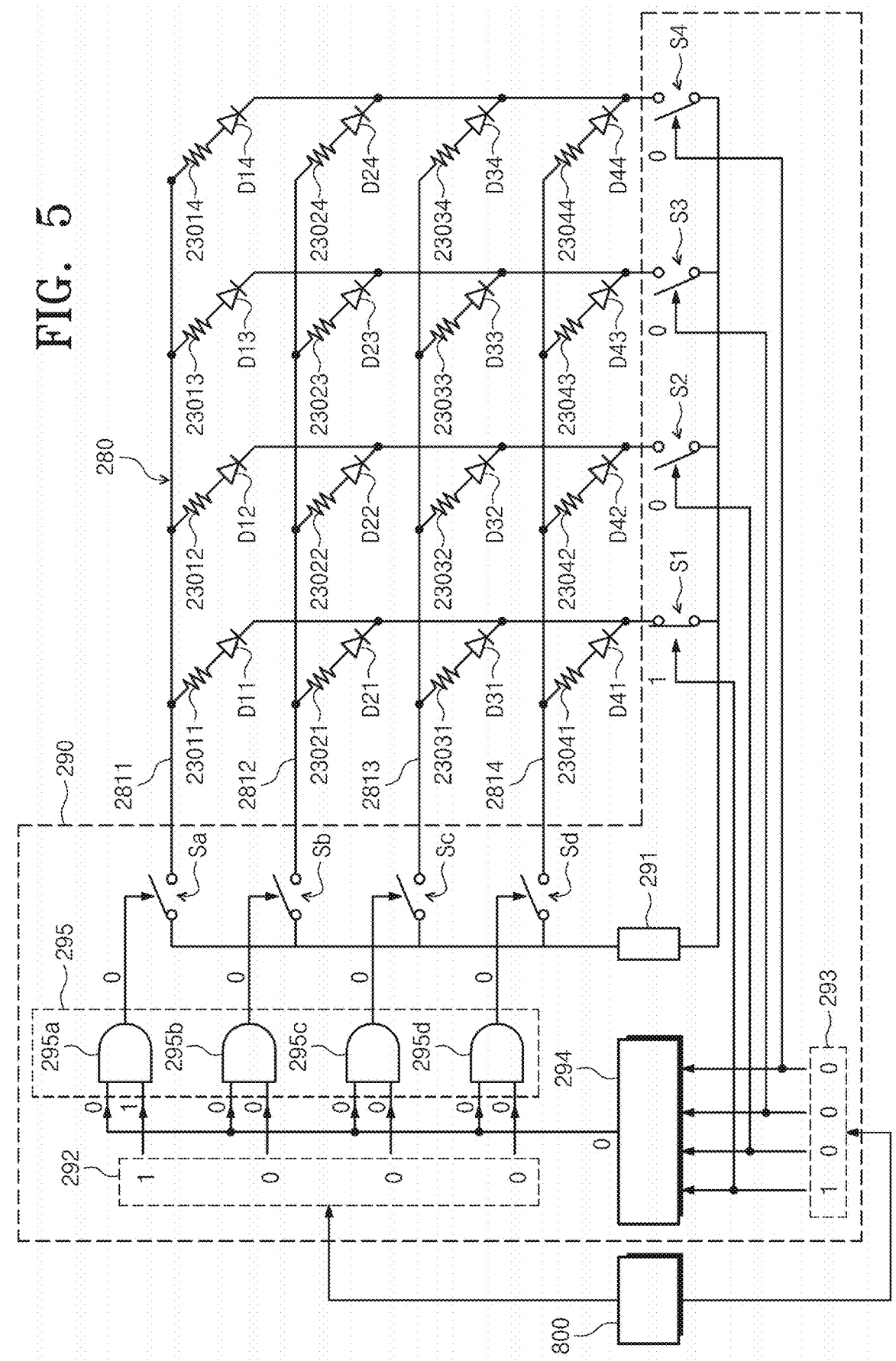
FIG. 5 is a diagram a state of a case where a control signal for operating one heating element is applied to the circuit structure of FIG. 3.

FIG. 5 is a diagram a state of a case where a control signal for operating one heating element is applied to the circuit structure of FIG. 3. Referring to FIG. 5, the controller 800 may input a signal of (1, 0, 0, 0) into the first input unit 292 and the second input unit 293. Therefore, the first return switch S1 may be on and the remaining return switches may be off.

The signal of (1, 0, 0, 0) input into the second input unit 293 may be input into the determination unit 294 as it is. Since the signal of (1, 0, 0, 0) is an input signal corresponding to Set 8 of the truth table, the determination unit 294 may determine False and output "0" which is the Off signal.

The signal of (1, 0, 0, 0) input into the first input unit 292 may be transferred to each of the AND gates 295*a*, 295*b*, 295*c*, and 295*d* of the gate unit 295. Further, the Off signal output by the determination unit 294 may be transferred to each of the AND gates 295*a*, 295*b*, 295*c*, and 295*d*.

In this case, there is no gate which outputs "1" which is the On signal among the AND gates 295*a*, 295*b*, 295*c*, and 295*d*. That is, when the controller 800 generates the driving signal for controlling only one heating element 230, the heating element 230 does not operate.

Figure 6:
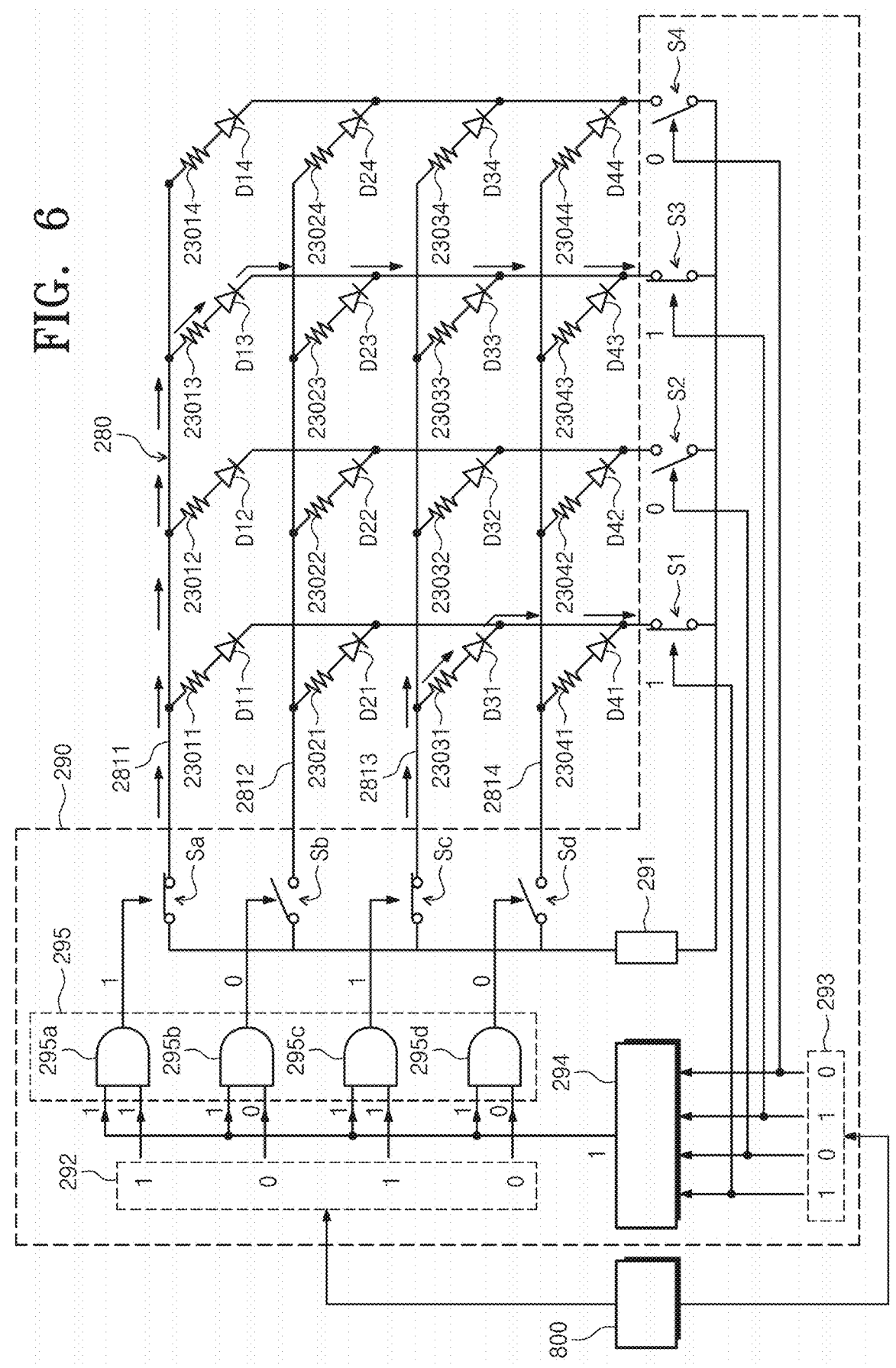
FIG. 6 is a diagram a state of a case where a control signal for operating two heating elements is applied to the circuit structure of FIG. 3.

FIG. 6 is a diagram a state of a case where a control signal for operating two heating elements is applied to the circuit structure of FIG. 3. Referring to FIG. 6, the controller 800 may input a signal of (1, 0, 1, 0) into the first input unit 292 and the second input unit 293. Therefore, the first return switch S1 and the third return switch S3 may be on and the remaining return switches may be off.

The signals of (1, 0, 1, 0) input into the second input unit 293 may be input into the determination unit 294 as it is. Since the signal of (1, 0, 1, 0) is an input signal corresponding to Set 10 of the truth table, the determination unit 294 may determine True and output "1" which is the Off signal.

The signal of (1, 0, 1, 0) input into the first input unit 292 may be transferred to each of the AND gates 295*a*, 295*b*, 295*c*, and 295*d* of the gate unit 295. Further, the On signal output by the determination unit 294 may be transferred to each of the AND gates 295*a*, 295*b*, 295*c*, and 295*d*.

In this case, the first AND gate 295*a* and the third AND gate 295*c* among the AND gates 295*a*, 295*b*, 295*c*, 295*d* output "1" which is the on signal. Therefore, the first supply switch Sa and the third supply switch Sc are on. Therefore, the power is applied to a 1-3$^{rd}$ heating element 23013 and a 3-1$^{st}$ heating element 23031 which may be driven.

That is, according to an exemplary embodiment of the present invention, at least two heating elements 230 may be continuously drive at the same time. That is, there is no case where one heating element 230 is driven alone. Continuously driving a plurality of heating elements 230 may be advantageous in heating the substrate W at a high speed and keeping a temperature of the substrate W at a high temperature, and according to the exemplary embodiment of the present invention, it may be easy to heat the substrate W at the high speed and keep the substrate at the high temperature. Further, when one heating element 230 is driven alone, a specific area of the substrate W may be locally heated, which may degrade temperature uniformity of the substrate W. However, since the plurality of heating elements 230 of the present invention are continuously driven jointly, it is possible to prevent that only the specific area of the substrate W is locally heated and the temperature uniformity of the substrate W is thus degraded.

Second Exemplary Embodiment

Other configurations of the substrate treating apparatus 10 may be the same or at least similar as matters described in the first exemplary embodiment except for a configuration of a supporting unit 200 according to a second exemplary embodiment.

Figure 7:
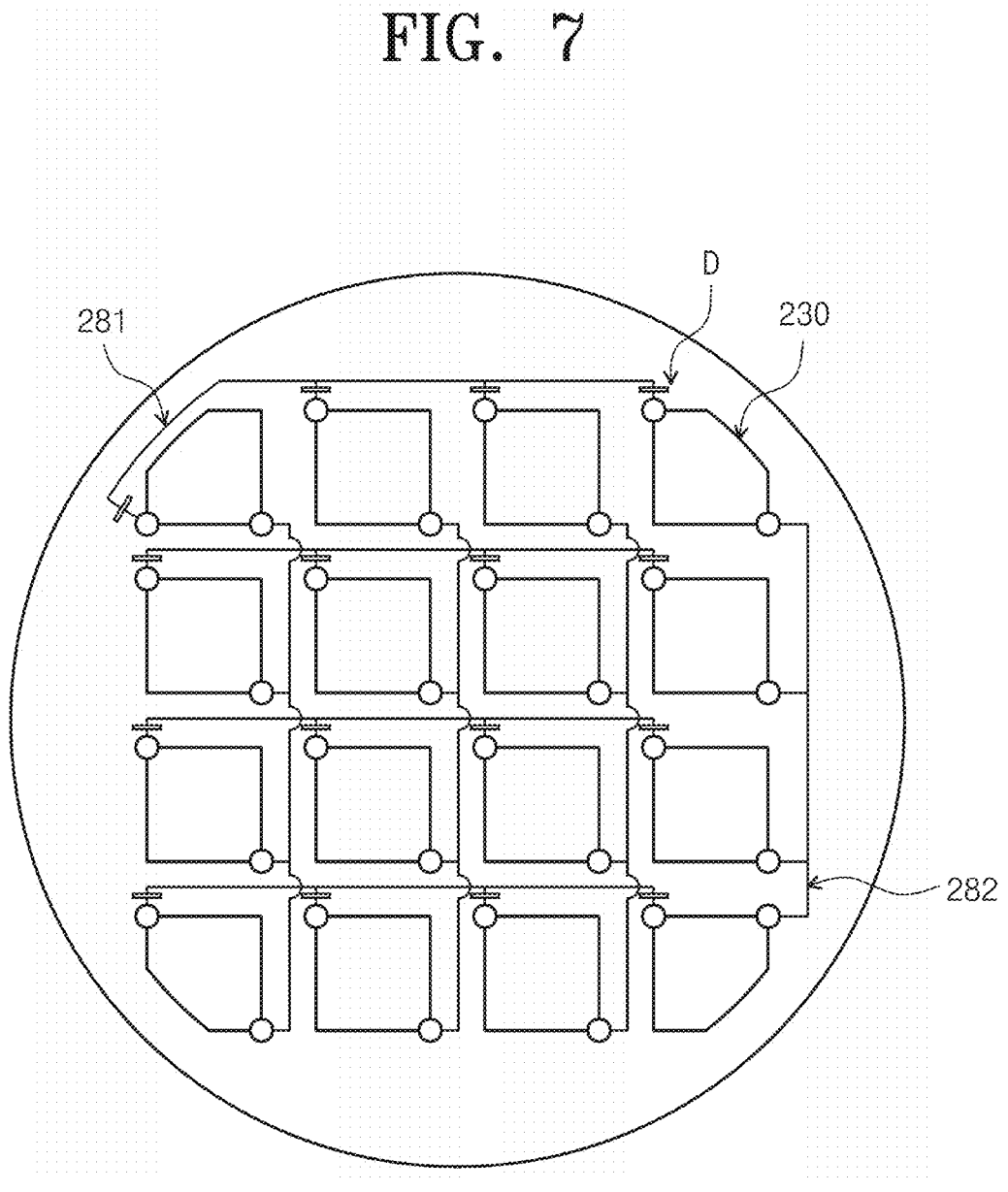
FIG. 7 is a diagram illustrating one plane of a supporting unit viewed from the top according to a second exemplary embodiment of the present invention.

FIG. 7 is a diagram illustrating one plane of a supporting unit viewed from the top according to a second exemplary embodiment of the present invention.

In the above-described example, it is described as an example that the rectifier D is installed on the power return line 282, but the present invention is not limited thereto, and the rectifier D may be installed on the power supply line 281 as illustrated in FIG. 7. The rectifier D may be buried in the support plate 210.

Third Exemplary Embodiment

Other configurations of the substrate treating apparatus 10 may be the same or at least similar as matters described in the first exemplary embodiment except for a configuration of a supporting unit 200 according to a second exemplary embodiment.

Figure 8:
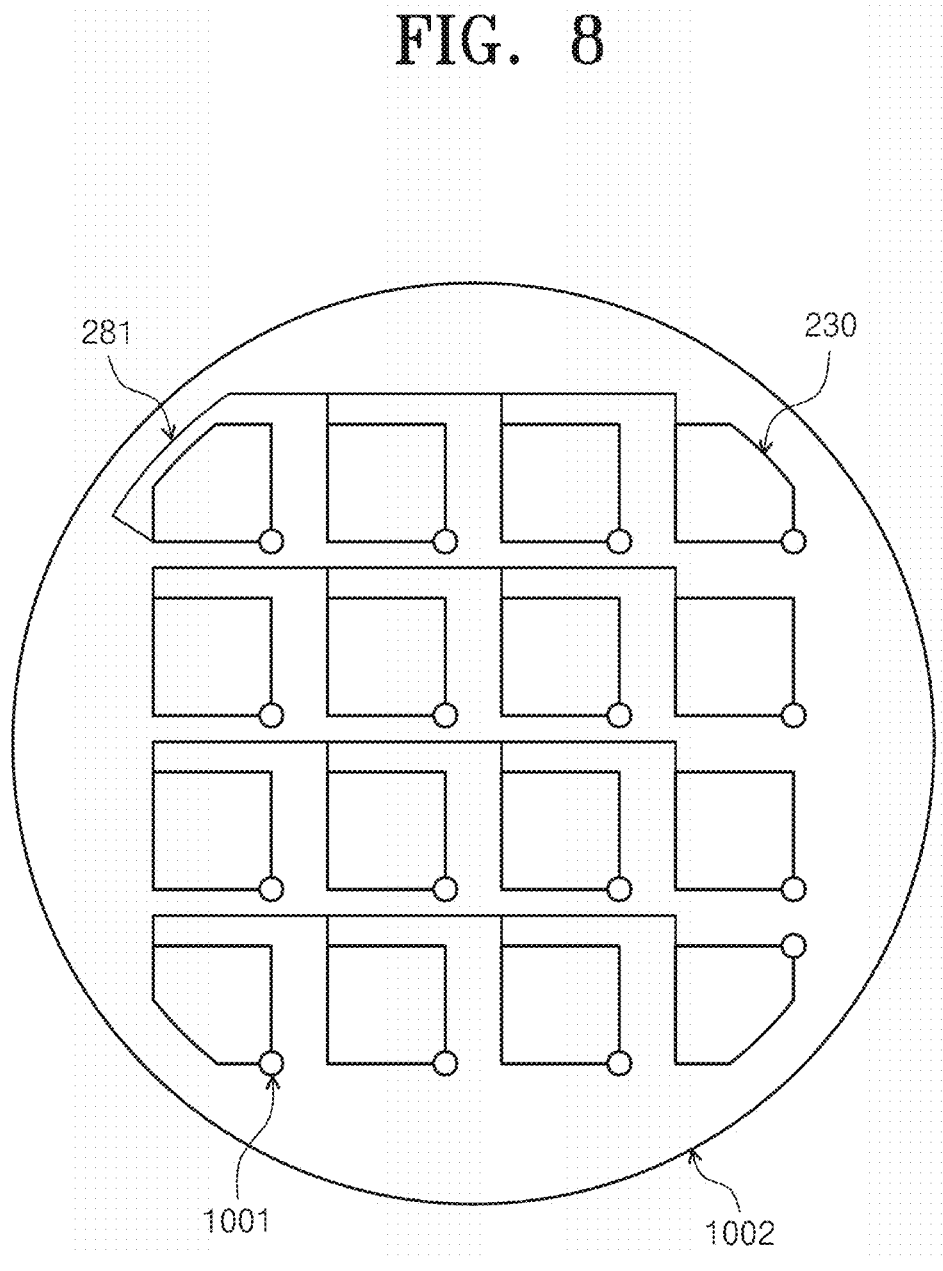
FIG. 8 is a diagram illustrating a first plane of a supporting unit viewed from the top according to a third exemplary embodiment of the present invention.
Figure 9:
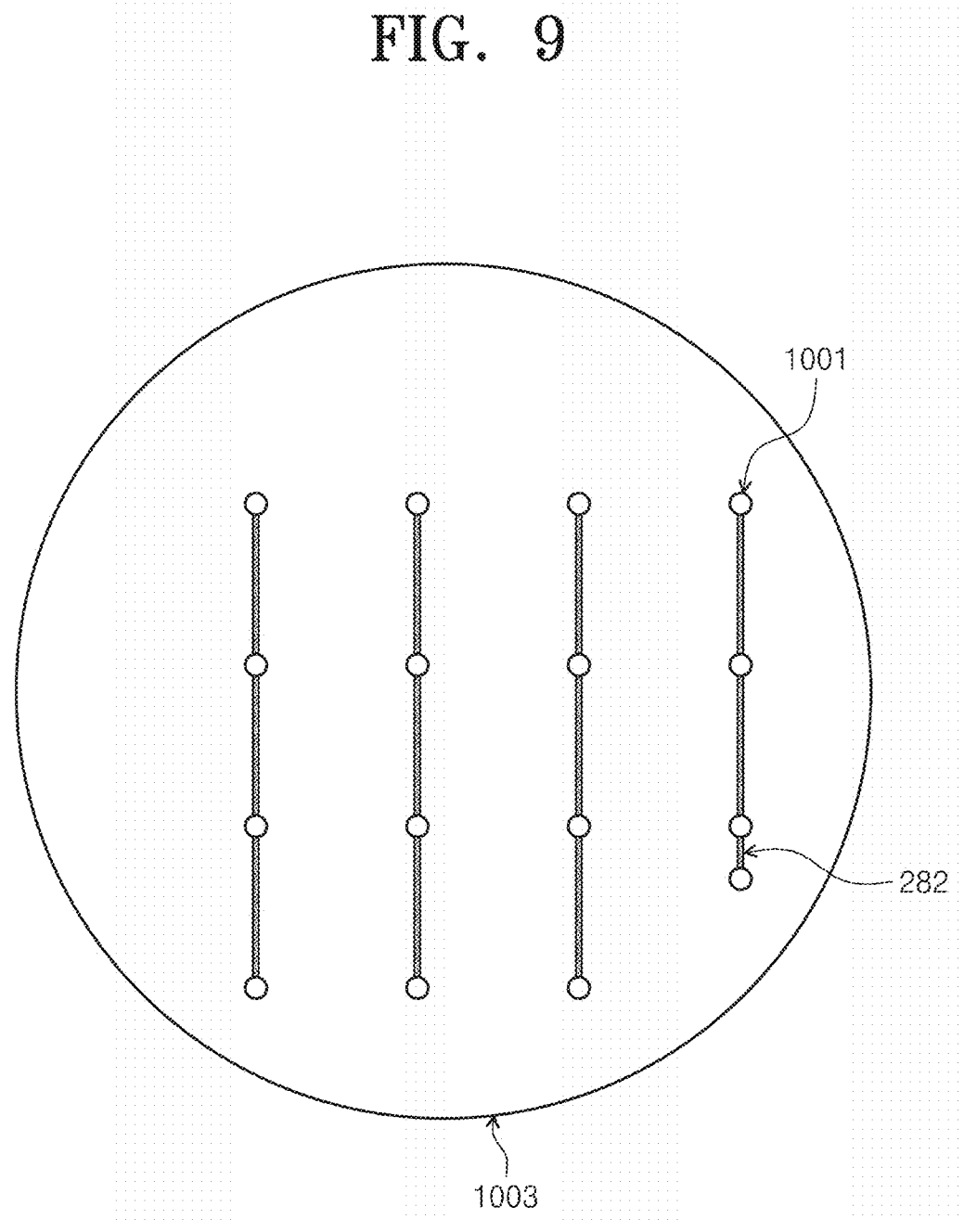
FIG. 9 is a diagram illustrating a second plane of the supporting unit of FIG. 8 viewed from the top.
Figure 10:
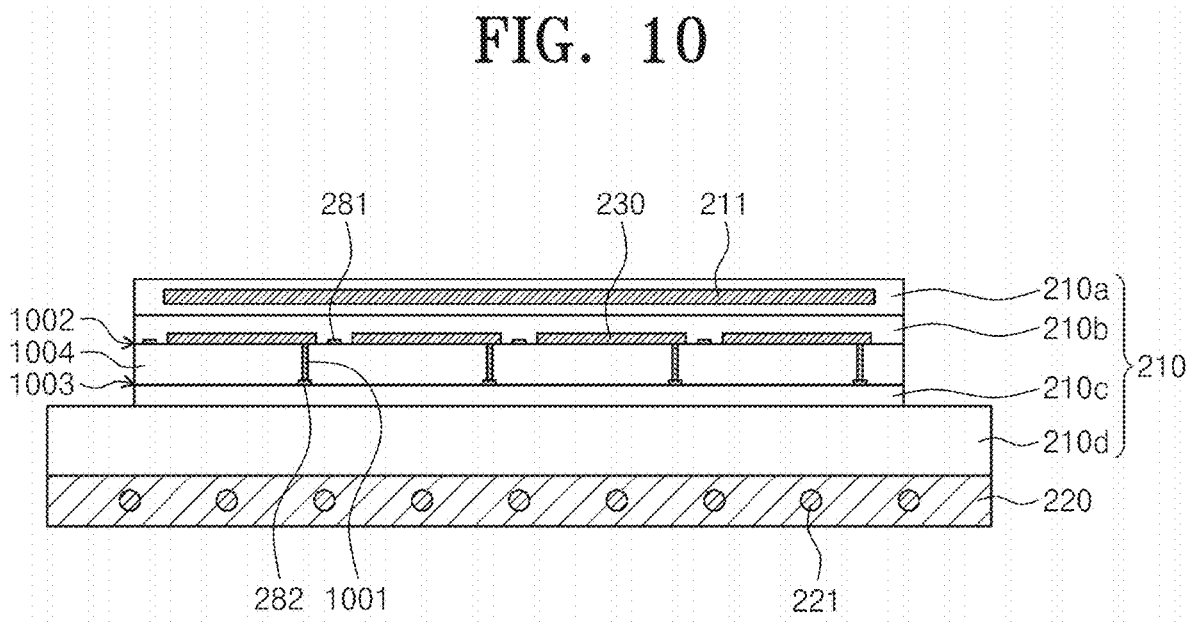
FIG. 10 is a cross-sectional view of the supporting unit of FIG. 8.

FIG. 8 is a diagram illustrating a first plane of a supporting unit viewed from the top according to a third exemplary embodiment of the present invention, FIG. 9 is a diagram illustrating a second plane of the supporting unit of FIG. 8 viewed from the top, and FIG. 10 is a cross-sectional view of the supporting unit of FIG. 8. Specifically, FIG. 8 is a diagram illustrating a first plane 1002 of a support plate 210 viewed from the top and FIG. 9 is a diagram illustrating a second plane 1003 of the support plate 210 viewed from the top.

Referring to FIGS. 8 to 10, the support plate 210 may include a first insulating layer 210*b*, a second insulating layer 210*c*, and a third insulating layer 1004 disposed between the first insulating layer 210*b* and the second insulating layer 210*c*. That is, the first insulating layer 210*b*, the third insulating layer 1004, and the second insulating layer 210*c* may be sequentially laminated and provided from the top to the bottom.

The heating element 230 may be provided to the first insulating layer 210*b*. The power supply line 281 may be provided to the first insulating layer 210*b*. The power return line 282 may be provided to the third insulating layer 1004.

Since the heating element 230 and the power supply line 281 are provided to the first insulating layer 210b which is the insulating layer, the heating element 230 and the power supply line 281 may be electrically connected to each other. Since the heating element 230 and the power return line 282 are provided to different insulating layers, the supporting unit 200 according to the third exemplary embodiment may have a conductive via 1001 electrically connecting the heating elements 230 and the power return line 282. The conductive vias 1001 may correspond to the heating elements 230, respectively. The conductive vias 1001 may be provided as a number corresponding to the heating elements 230.

Fourth Exemplary Embodiment

Other configurations of the substrate treating apparatus 10 may be the same or at least similar as matters described in the first exemplary embodiment except for a configuration of a supporting unit 200 according to a fourth exemplary embodiment.

Figure 11:
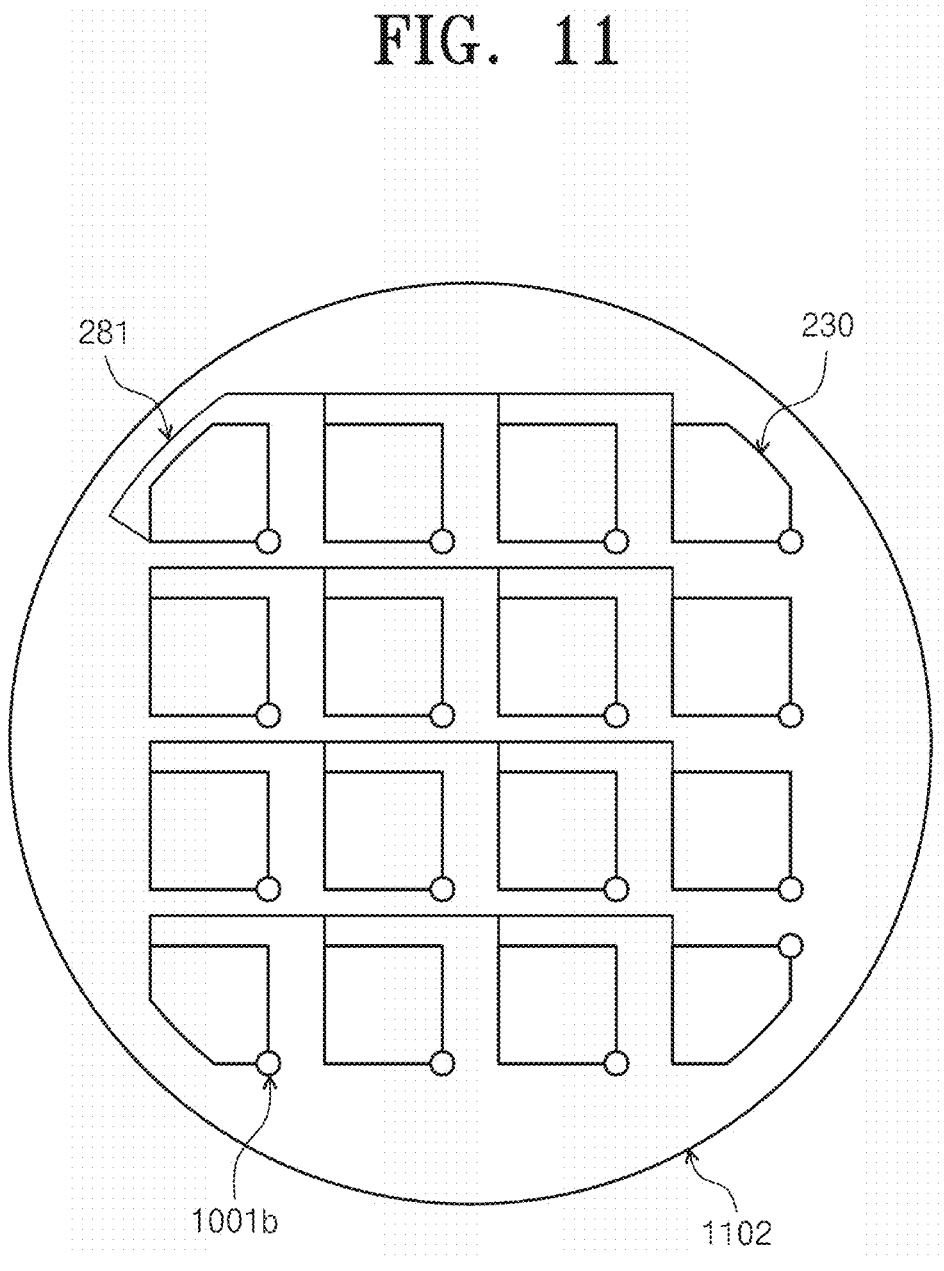
FIG. 11 is a diagram illustrating a first plane of a supporting unit viewed from the top according to a fourth exemplary embodiment of the present invention.
Figure 12:
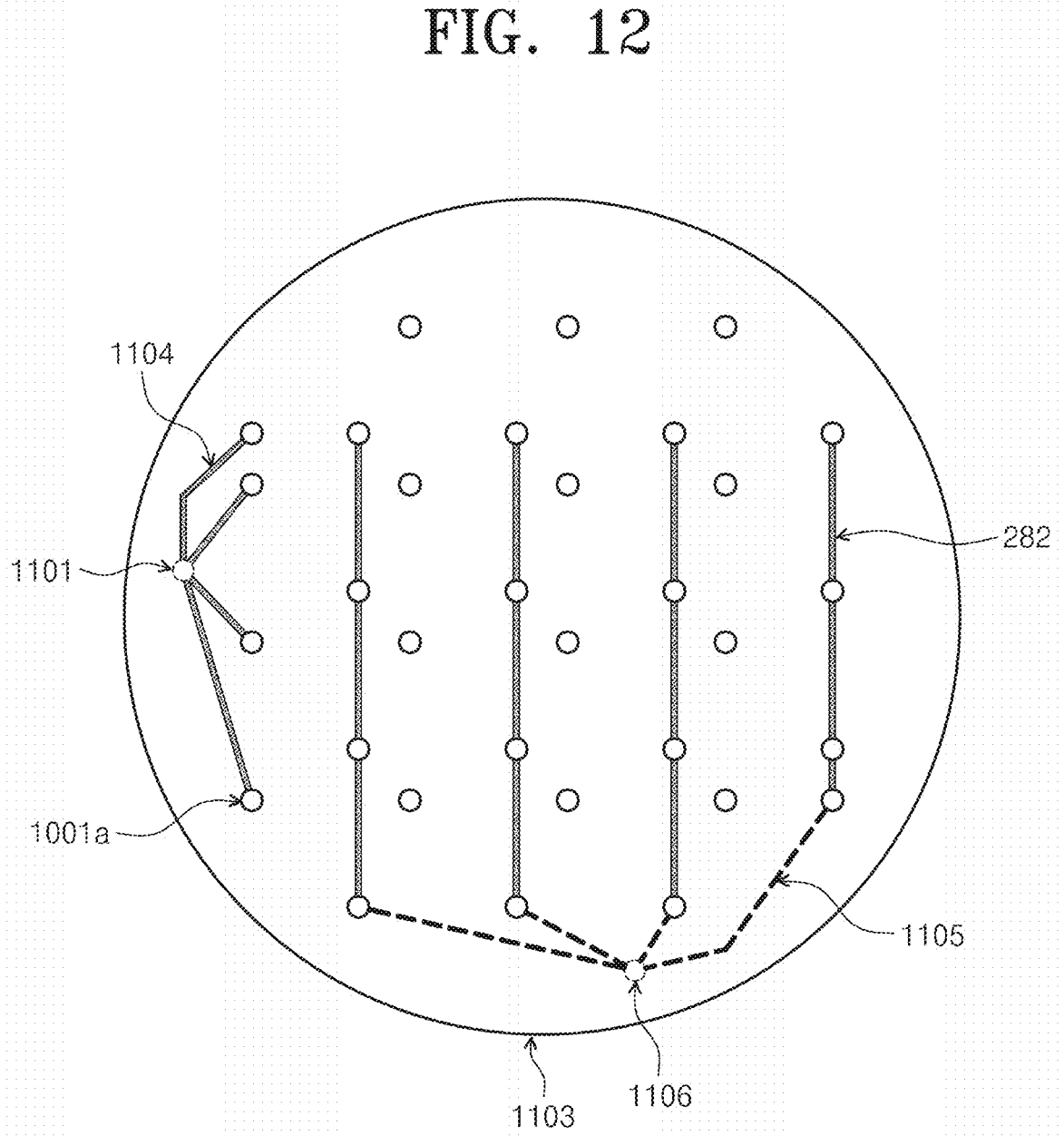
FIG. 12 is a diagram illustrating a second plane of FIG. 11 viewed from the top.

FIG. 11 is a diagram illustrating a first plane of a supporting unit viewed from the top according to a fourth exemplary embodiment of the present invention. FIG. 12 is a diagram illustrating a second plane of FIG. 11 viewed from the top.

Referring to FIGS. 11 and 12, the power supply line 281 and the heating elements 230 may be provided on a first plane 1102 which is the same plane. Further, the power return line 282 may be provided on a second plane 1103. The first plane 1102 and the second plane 1103 may be separated from each other by the insulating layer.

The power supply lines 281 may be electrically connected to first leads 1104 in the second plane 1103 through first conductive vias 1001a extended between the first plane 1102 and the second plane 1103. The first leads 1104 may pass through a first hole 1101 formed on the electrode plate 220 which may be a cooling plate while maintaining electrical insulation between the leads.

The power return lines 282 may be electrically connected to second leads 1105 in the second plane 1103 through second conductive vias 1001b extended between the first plane 1102 and the second plane 1105. The second leads 1105 may pass through a second hole 1106 formed on the electrode plate 220 which may be the cooling plate while maintaining the electrical insulation between the leads. When the heating element 230, the power supply line 281, and the power return line 282 are arranged as such, the temperature uniformity of the substrate W may be enhanced by reducing the number of holes formed on the electrode plate 220.

Fifth Exemplary Embodiment

Other configurations of the substrate treating apparatus 10 may be the same or at least similar as matters described in the first exemplary embodiment except for a configuration of a supporting unit 200 according to a fifth exemplary embodiment.

Figure 13:
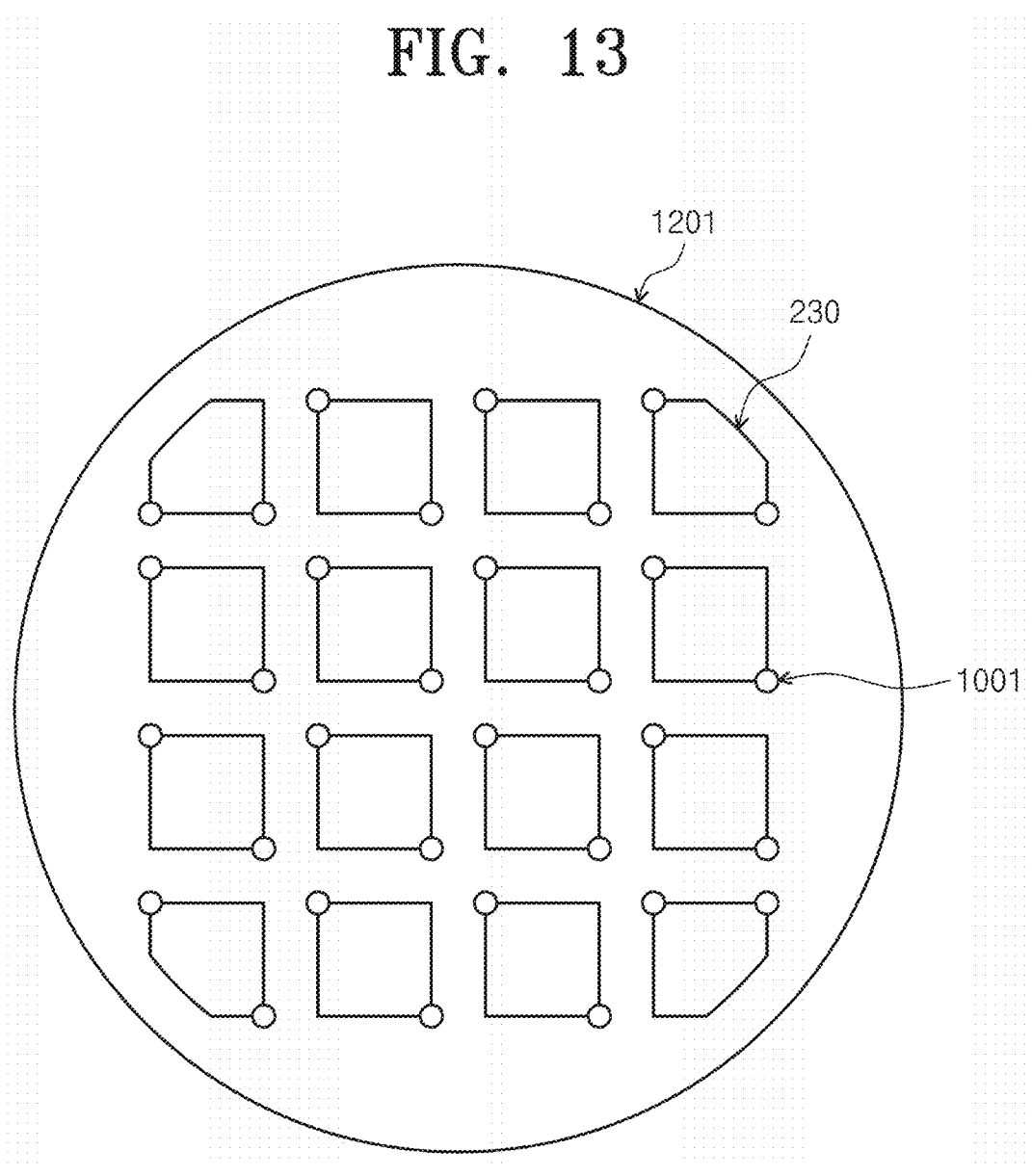
FIG. 13 is a diagram illustrating a first plane of a supporting unit viewed from the top according to a fifth exemplary embodiment of the present invention.
Figure 14:
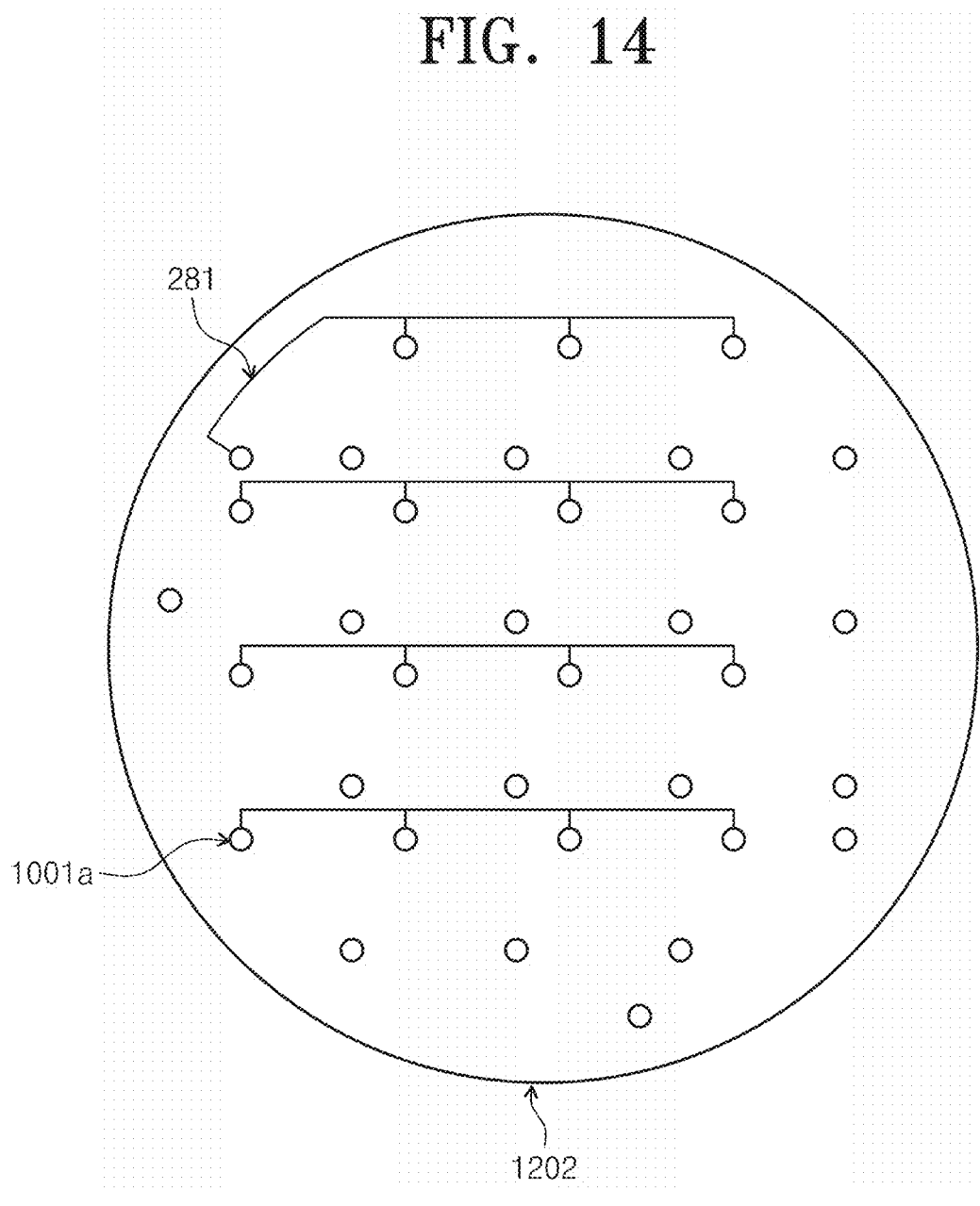
FIG. 14 is a diagram illustrating a second plane of the supporting unit of FIG. 13 viewed from the top.
Figure 15:
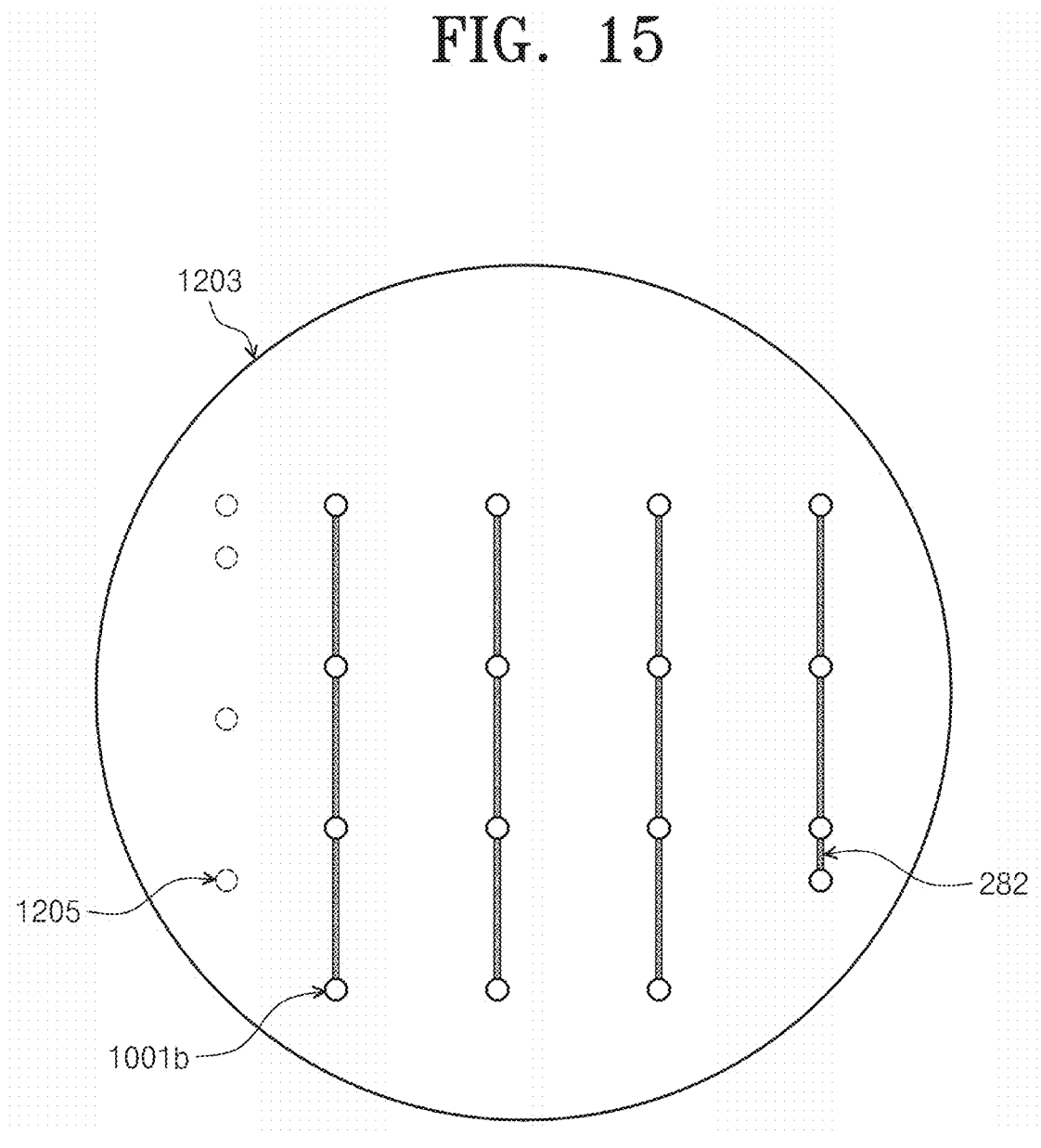
FIG. 15 is a diagram illustrating a third plane of the supporting unit of FIG. 13 viewed from the top.
Figure 16:
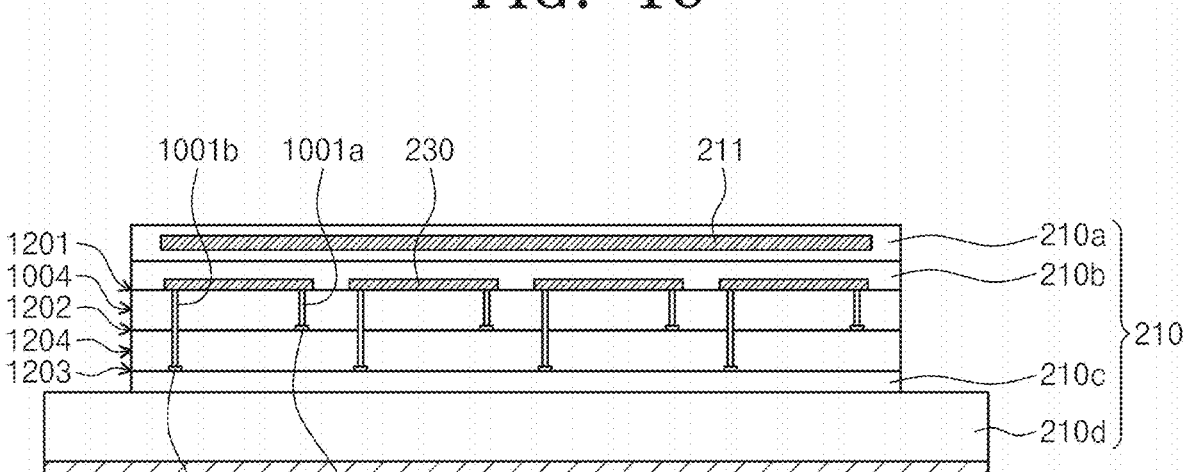
FIG. 16 is a cross-sectional view of the supporting unit of FIG. 13.

FIG. 13 is a diagram illustrating a first plane of a supporting unit viewed from the top according to a fifth exemplary embodiment of the present invention, FIG. 14 is a diagram illustrating a second plane of the supporting unit of FIG. 13 viewed from the top, FIG. 15 is a diagram illustrating a third plane of the supporting unit of FIG. 13 viewed from the top, and FIG. 16 is a cross-sectional view of the supporting unit of FIG. 13.

Specifically, FIG. 13 is a diagram illustrating a first plane 1201 of the support plate 210 viewed from the top, FIG. 14 is a diagram illustrating a second plane 1202 of the support plate 210 viewed from the top, and FIG. 15 is a diagram illustrating a third plane 1203 of the support plate 210 viewed from the top.

Referring to FIGS. 13 to 16, the supporting unit 200 according to the fifth exemplary embodiment may further include at a third insulating layer 1004 and a fourth insulating layer 1204 provided between the first insulating layer 210b and the second insulating layer 210c. The third insulating layer 1004 may be disposed below the first insulating layer 210b, the fourth insulating layer 1204 may be disposed below the third insulating layer 1004, and the second insulating layer 210c may be disposed below the fourth insulating layer 1204.

The heating elements 230 may be provided to the first insulating layer 210b. The power supply line 281 may be provided to the third insulating layer 1004. The power return line 282 may be provided to the fourth insulating layer 1204. Further, the supporting unit 200 may include a plurality of first conductive vias 1001a that electrically connects the heating elements 230 provided to the first insulating layer 210b and the power supply lines 281 provided to the third insulating layer 1004 to each other. Further, the supporting unit 200 may include a plurality of second conductive vias 1001b that electrically connects the heating elements 230 provided to the first insulating layer 210b and the power return lines 282 provided to the fourth insulating layer 1204 to each other.

Second Exemplary Embodiment

Other configurations of the substrate treating apparatus 10 may be the same or at least similar as matters described in the first exemplary embodiment except for a configuration of a supporting unit 200 according to a sixth exemplary embodiment.

Figure 17:
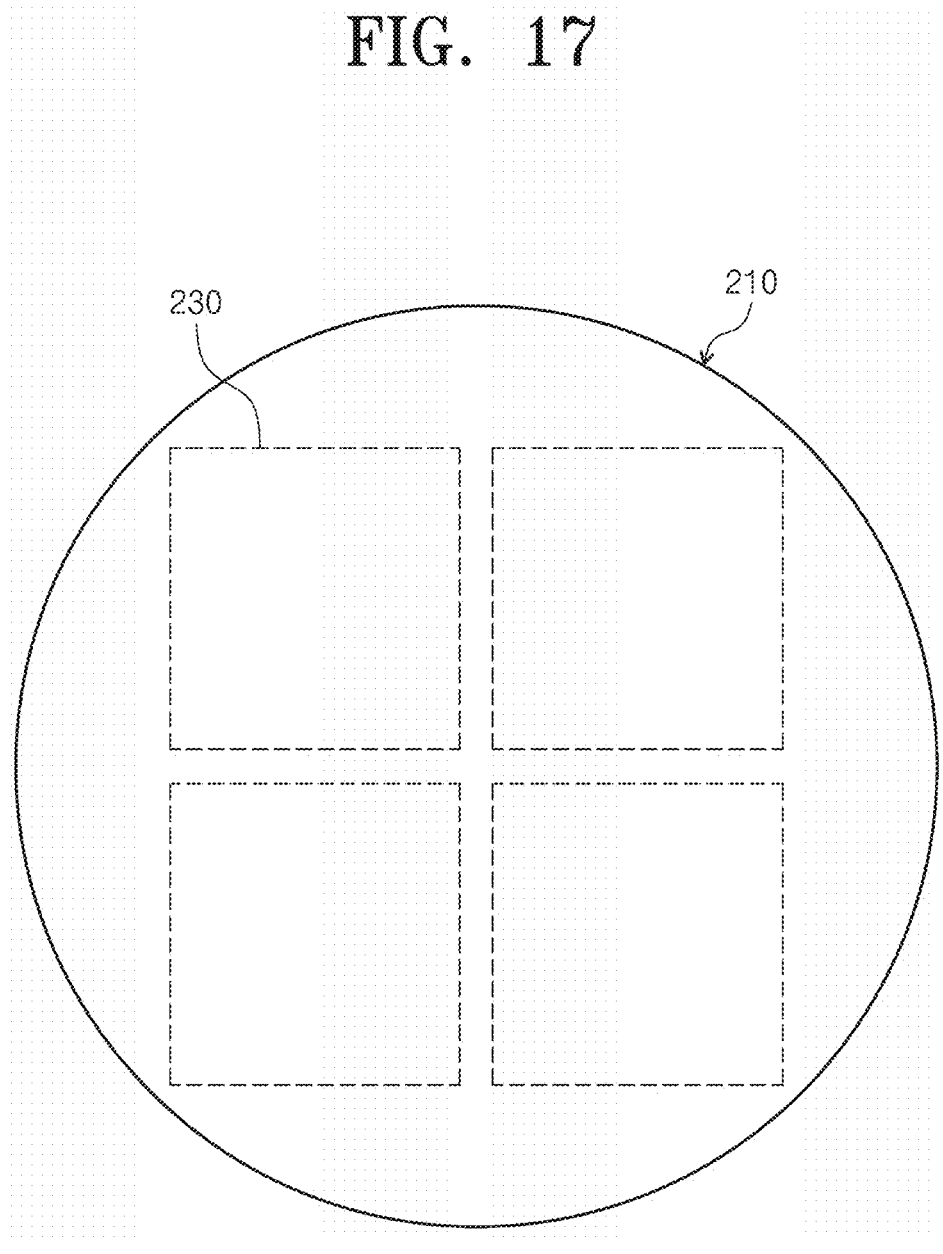
FIG. 17 is a diagram schematically illustrating a layout of a heating element of a supporting unit according to a sixth exemplary embodiment of the present invention.

FIG. 17 is a diagram schematically illustrating a layout of a heating element of a supporting unit according to a sixth exemplary embodiment of the present invention.

In the above-described example, it is described as an example that the heating element 230 is provided in an array of 4×4. The array of the heating element 230 may also include an array of 2×2 illustrated in FIG. 17.

Second Embodiment

Other configurations of the substrate treating apparatus 10 may be the same or at least similar as matters described in the first exemplary embodiment except for a configuration of a supporting unit 200 according to a seventh exemplary embodiment.

Figure 18:
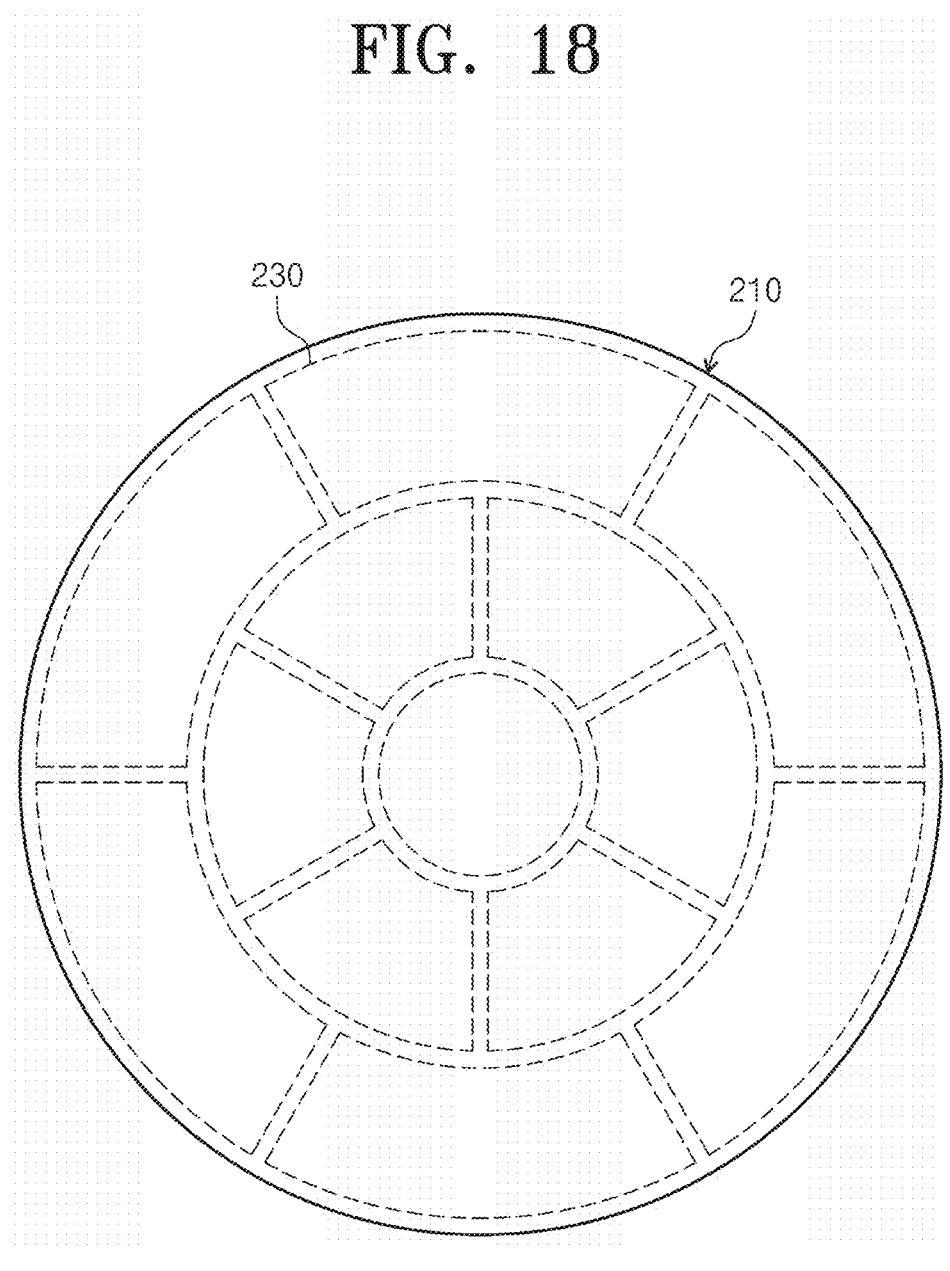
FIG. 18 is a diagram schematically illustrating a layout of a heating element of a supporting unit according to a seventh exemplary embodiment of the present invention.

FIG. 18 is a diagram schematically illustrating a layout of a heating element of a supporting unit according to a seventh exemplary embodiment of the present invention.

In the above-described example, it is described as an example that the heating element 230 is arrayed in a matrix form, but the present invention is not limited thereto. For example, as illustrated in FIG. 18, when viewed from the top, some of the heating elements 230 may be arranged at a central area of the support plate 210 and other some of the heating elements 230 may be arranged at a peripheral area of the support plate 210 to surround the heating elements 230 arranged in the central area of the support plate 210. The heating elements 230 arranged at the peripheral area of the support plate 210 may be divided into a group arranged at a first peripheral area adjacent to the central area and a group arranged at a second peripheral area distant from the central area of the support plate 210 than the first peripheral area. Further, when viewed from the top, the heating elements 230 arranged at the peripheral area of the support plate 210 may be arranged to be spaced apart from each other in a circumferential direction of the plate 210.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A supporting unit supporting a substrate, comprising:
a plate;
heating elements in the plate, the heating elements being configured to control a temperature of a substrate, the heating elements being arranged to control temperatures of different areas of the substrate; and
a power supply module configured to supply power to the heating elements,
wherein the power supply module is configured to always supply the power to at least two heating elements of the heating elements,
wherein the power supply module including:
a power supply configured to generate the power;
power supply lines connected to power supply stages for the heating elements;
power return lines connected to power return stages of the heating elements;
each of the heating elements do not share a same one of the power supply lines and power return lines;
supply switches installed in the power supply lines, respectively;
return switches installed in the power return lines, respectively;
a first input unit configured to receive a first control signal for controlling the supply switches from a controller;
a second input unit configured to receive a second control signal for controlling the return switch from the controller;
a determination unit that is configured to receive the control signal received by the second input unit and outputs an On signal again when the received signals include at least two On signals; and
a gate unit configured to receive the signal output by the determination unit and the signal input into the first input unit, and
wherein the gate unit includes AND gates corresponding to the supply switches, respectively, and the AND gates receive the signal input into the first input unit and an output signal output by the determination unit.

2. The supporting unit of claim 1, wherein a rectifier is installed at a rear stage of the heating elements.

3. An apparatus for treating a substrate, the apparatus comprising:
a chamber defining a treating space in which a substrate is treated therein; and
a support configured to support and heat the substrate in the treating space,
wherein the support includes a plate,
heating elements provided to the plate and heating the substrate, wherein the heating elements are arranged to control temperatures of different areas of the substrate, and
a power supply module configured to supply power to the heating elements, and
the power supply module is configured to always supply the power to at least two heating elements of the heating elements,
wherein the power supply module including:
a power supply configured to generate the power;
power supply lines connected to power supply stages for the heating elements;
power return lines connected to power return stages of the heating elements;
each of the heating elements do not share a same one of the power supply lines and power return lines;
supply switches installed in the power supply lines, respectively;
return switches installed in the power return lines, respectively;
a first input unit configured to receive a first control signal for controlling the supply switches from a controller;
a second input unit configured to receive a second control signal for controlling the return switch from the controller;
a determination unit that is configured to receive the control signal received by the second input unit and outputs an On signal again when the received signals include at least two On signals; and
a gate unit configured to receive the signal output by the determination unit and the signal input into the first input unit, and
wherein the gate unit includes AND gates corresponding to the supply switches, respectively, and the AND gates receive the signal input into the first input unit and an output signal output by the determination unit.

4. An apparatus for treating a substrate, the apparatus comprising:
a chamber defining a treating space in which a substrate is treated therein;
a support configured to support the substrate in the treating space;
a plasma source configured to generate plasma for treating the substrate in the treating space; and
a controller,
wherein the supporting includes a plate,
heating elements in the plate and configured to heat the substrate, the heating elements are being arranged to control temperatures of different areas of the substrate, and
a power supply module configured to supply power to the heating elements, and
the power supply module is configured to continuously always supply the power to at least two heating elements of the heating elements,
wherein
the power supply module includes,
a power supply configured to generate power applied to the heating elements, power supply lines connected to power supply stages of the heating elements, power return lines connected to power return stages of the heating elements, supply switches installed in the power supply lines, respectively, return switches installed in the power return lines, respectively, a first input unit configured to receive a first control signal for controlling the supply switches from the controller, a second input unit configured to receive a second control signal for controlling the return switches from the controller, a determination unit configured to receive the control signal received by the second input unit and outputs an On signal again when the received signals include at least two On signals, and a gate unit configured to receive the signal output by the determination unit and the signal input by the first input unit, each of the heating elements is connected to any one of the power supply lines and any one of the power return lines, and the heating elements do not share a same power supply line and power return line.

* * * * *